United States Patent [19]

Takahara et al.

US005196738A

[11] Patent Number: 5,196,738

[45] Date of Patent: Mar. 23, 1993

[54] DATA DRIVER CIRCUIT OF LIQUID CRYSTAL DISPLAY FOR ACHIEVING DIGITAL GRAY-SCALE

[75] Inventors: Kazuhiro Takahara; Tadahisa Yamaguchi; Masami Oda; Hisashi Yamaguchi, all of Atsugi; Tetsuo Aoki, Kawasaki; Fumitaka Asami, Kunitachi, all of Japan

[73] Assignee: Fujitsu Limited, Kawasaki, Japan

[21] Appl. No.: 766,132

[22] Filed: Sep. 27, 1991

[30] Foreign Application Priority Data

Sep. 28, 1990 [JP] Japan .................................. 2-259300
May 21, 1991 [JP] Japan .................................. 3-116036

[51] Int. Cl.[5] .......................... H03K 3/01; H09G 3/00

[52] U.S. Cl. .................................. 307/296.1; 340/784; 340/793

[58] Field of Search .............................. 307/475, 296.1; 340/784, 793, 811, 813

[56] References Cited

U.S. PATENT DOCUMENTS 3,522,420 8/1970 Hartmann et al. ............ 235/150.52
3,560,957 2/1971 Miura et al. ......................... 340/347
5,099,192 3/1992 Thayer et al. .................... 307/296.1

FOREIGN PATENT DOCUMENTS 0071911 2/1983 European Pat. Off. .
0478386 4/1992 European Pat. Off. .
0488516 6/1992 European Pat. Off. .

OTHER PUBLICATIONS

Patent Abstracts of Japan, vol. 12, No. 402 (E-673) Oct. 25, 1988 & JP-A-63 141414 (Matsushita Electric Ind. Co.) Jun. 13, 1988.

Patent Abstracts of Japan, vol. 14, No. 487 (P-1121) Oct. 23, 1990 & JP-A-2 198432 (Nec Co.) Aug. 6, 1990.

"Driving Method for TFT/LCD Grayscale," IBM Technical Disclosure Bulletin, vol. 33, No. 68, Nov. 1990, New York, N.Y., pp. 384-385.

*Primary Examiner*—David Mis
*Attorney, Agent, or Firm*—Staas & Halsey

[57] ABSTRACT

A data driver circuit of TFT-LCD having a plurality of power source voltage terminals with different voltage levels, an output terminal for providing a voltage to the TFT-LCD, a plurality of analog switches with load resistances provided between one of the source voltage terminals and the output terminal and having a switching terminal, and a voltage selection circuit for transmitting an ON signal to a selected one or more of the respective switching terminals of the analog switches. When an individual analog switch is turned ON, the corresponding source voltage value is supplied to the output terminal of the driver circuit and when two or more analog switches are selectively turned on, a combination of the voltage levels of the respective source voltage is associated with those switches which are turned ON is produced as the driver circuit output voltage, thereby affording a greater number of gray levels as the driver circuit output voltage levels than the number of power source voltage levels.

32 Claims, 24 Drawing Sheets

| | DATA | | | APPLIED VOLTAGE | | | | | | | | |
|---|---|---|---|---|---|---|---|---|---|---|---|---|
| GRAY-SCALE NUMBER | $D_0$ | $D_1$ | $D_2$ | $V_0$ | $V_1$ | $V_2$ | $V_3$ | $V_4$ | $V_5$ | $V_6$ | $V_7$ | OUTPUT |
| 0 | 0 | 0 | 0 | 1 | 0 | 0 | 0 | 0 | 0 | 0 | 0 | $V_0$ |
| 1 | 1 | 0 | 0 | 0 | 1 | 0 | 0 | 0 | 0 | 0 | 0 | $V_1$ |
| 2 | 0 | 1 | 0 | 0 | 0 | 1 | 0 | 0 | 0 | 0 | 0 | $V_2$ |
| 3 | 1 | 1 | 0 | 0 | 0 | 0 | 1 | 0 | 0 | 0 | 0 | $V_3$ |
| 4 | 0 | 0 | 1 | 0 | 0 | 0 | 0 | 1 | 0 | 0 | 0 | $V_4$ |
| 5 | | 0 | 1 | 0 | 0 | 0 | 0 | 0 | 1 | 0 | 0 | $V_5$ |
| 6 | 0 | 1 | 1 | 0 | 0 | 0 | 0 | 0 | 0 | 1 | 0 | $V_6$ |
| 7 | 1 | 1 | 1 | 0 | 0 | 0 | 0 | 0 | 0 | 0 | 1 | $V_7$ |

Fig. 7 PRIOR ART

| | | | | | |
|---|---|---|---|---|---|
| NUMBER OF GRAY-SCALE<br>NUMBER OF OUTPUT LEVELS | | 4 | 8 | 16 | 32 |
| NUMBER OF DISPLAYED COLORS | | 64 | 512 | 4096 | 32000 |
| NUMBER OF GATES | LOGIC | 2720 | 5040 | 9280 | 18000 |
| | OUTPUT | 640 | 1280 | 2560 | 5120 |
| CHIP AREA | | LESS THAN 6mm X 6mm SQUARE | LESS THAN 10mm X 10mm SQUARE | MORE THAN 15mm X 15mm SQUARE | X |

Fig. 11

| GRAY-SCALE NUMBER | DATA | | | | APPLIED VOLTAGE | | | | | | | | OUTPUT VOLTAGE |
|---|---|---|---|---|---|---|---|---|---|---|---|---|---|
| | $D_0$ | $D_1$ | $D_2$ | $D_3$ | $V_0$ | $V_1$ | $V_2$ | $V_3$ | $V_4$ | $V_5$ | $V_6$ | $V_7$ | Yn(V) |
| 0 | 0 | 0 | 0 | 0 | 1 | 0 | 0 | 0 | 1 | 0 | 0 | 0 | $(V_0+V_4)/2 = 2.0$ |
| 1 | 1 | 0 | 0 | 0 | 0 | 1 | 0 | 0 | 1 | 0 | 0 | 0 | $(V_1+V_4)/2 = 2.2$ |
| 2 | 0 | 1 | 0 | 0 | 0 | 0 | 1 | 0 | 1 | 0 | 0 | 0 | $(V_2+V_4)/2 = 2.4$ |
| 3 | 1 | 1 | 0 | 0 | 0 | 0 | 0 | 1 | 1 | 0 | 0 | 0 | $(V_3+V_4)/2 = 2.6$ |
| 4 | 0 | 0 | 1 | 0 | 1 | 0 | 0 | 0 | 0 | 1 | 0 | 0 | $(V_0+V_5)/2 = 2.8$ |
| 5 | 1 | 0 | 1 | 0 | 0 | 1 | 0 | 0 | 0 | 1 | 0 | 0 | $(V_1+V_5)/2 = 3.0$ |
| 6 | 0 | 1 | 1 | 0 | 0 | 0 | 1 | 0 | 0 | 1 | 0 | 0 | $(V_2+V_5)/2 = 3.2$ |
| 7 | 1 | 1 | 1 | 0 | 0 | 0 | 0 | 1 | 0 | 1 | 0 | 0 | $(V_3+V_5)/2 = 3.4$ |
| 8 | 0 | 0 | 0 | 1 | 1 | 0 | 0 | 0 | 0 | 0 | 1 | 0 | $(V_0+V_6)/2 = 3.6$ |
| 9 | 1 | 0 | 0 | 1 | 0 | 1 | 0 | 0 | 0 | 0 | 1 | 0 | $(V_1+V_6)/2 = 3.8$ |
| 10 | 0 | 1 | 0 | 1 | 0 | 0 | 1 | 0 | 0 | 0 | 1 | 0 | $(V_2+V_6)/2 = 4.0$ |
| 11 | 1 | 1 | 0 | 1 | 0 | 0 | 0 | 1 | 0 | 0 | 1 | 0 | $(V_3+V_6)/2 = 4.2$ |
| 12 | 0 | 0 | 1 | 1 | 1 | 0 | 0 | 0 | 0 | 0 | 0 | 1 | $(V_0+V_7)/2 = 4.4$ |
| 13 | 1 | 0 | 1 | 1 | 0 | 1 | 0 | 0 | 0 | 0 | 0 | 1 | $(V_1+V_7)/2 = 4.6$ |
| 14 | 0 | 1 | 1 | 1 | 0 | 0 | 1 | 0 | 0 | 0 | 0 | 1 | $(V_2+V_7)/2 = 4.8$ |
| 15 | 1 | 1 | 1 | 1 | 0 | 0 | 0 | 1 | 0 | 0 | 0 | 1 | $(V_3+V_7)/2 = 5.0$ |
| | | | | | 2 | 2.4 | 2.8 | 3.2 | 2 | 3.6 | 5.2 | 6.8 | (V) |

Fig. 15

| GRADATION | DATA | | | | APPLIED VOLTAGE | | | | | | | | | OUTPUT VOLTAGE |
|---|---|---|---|---|---|---|---|---|---|---|---|---|---|---|
| | $D_0$ | $D_1$ | $D_2$ | $D_3$ | $V_0$ | $V_1$ | $V_2$ | $V_3$ | $V_4$ | $V_5$ | $V_6$ | $V_7$ | $V_8$ | Yn(V) |
| 0 | O | O | O | O | – | O | O | O | O | O | O | O | O | $V_0$ =2.0 |
| 1 | – | O | O | O | – | – | O | O | O | O | O | O | O | $(V_0+V_1)/2$ =2.2 |
| 2 | O | – | O | O | O | – | O | O | O | O | O | O | O | $V_1$ =2.4 |
| 3 | – | – | O | O | O | – | – | O | O | O | O | O | O | $(V_1+V_2)/2$ =2.6 |
| 4 | O | O | – | O | O | O | – | O | O | O | O | O | O | $V_2$ =2.8 |
| 5 | – | O | – | O | O | O | – | – | O | O | O | O | O | $(V_2+V_3)/2$ =3.0 |
| 6 | O | – | – | O | O | O | O | – | O | O | O | O | O | $V_3$ =3.2 |
| 7 | – | – | – | O | O | O | O | – | – | O | O | O | O | $(V_3+V_4)/2$ =3.4 |
| 8 | O | O | O | – | O | O | O | O | – | O | O | O | O | $V_4$ =3.6 |
| 9 | – | O | O | – | O | O | O | O | – | – | O | O | O | $(V_4+V_5)/2$ =3.8 |
| 10 | O | – | O | – | O | O | O | O | O | – | O | O | O | $V_5$ =4.0 |
| 11 | – | – | O | – | O | O | O | O | O | – | – | O | O | $(V_5+V_6)/2$ =4.2 |
| 12 | O | O | – | – | O | O | O | O | O | O | – | O | O | $V_6$ =4.4 |
| 13 | – | O | – | – | O | O | O | O | O | O | – | – | O | $(V_6+V_7)/2$ =4.6 |
| 14 | O | – | – | – | O | O | O | O | O | O | O | – | O | $V_7$ =4.8 |
| 15 | – | – | – | – | O | O | O | O | O | O | O | O | – | $V_8$ =5.2 |
| | | | | | 2.0 | 2.4 | 2.8 | 3.2 | 3.6 | 4.0 | 4.4 | 4.8 | 5.2 | (V) |

Fig. 20

| GRAY-SCALE NUMBER | INPUT DATA D0D1D2D3 | $V_5$ (5.2) Ra | $V_5$ (5.2) Rb | $V_4$ (4.4) Ra | $V_4$ (4.4) Rb | $V_3$ (3.6) Ra | $V_3$ (3.6) Rb | $V_2$ (2.8) Ra | $V_2$ (2.8) Rb | $V_1$ (2.0) Ra | $V_1$ (2.0) Rb | OUTPUT VOLTAGE | |
|---|---|---|---|---|---|---|---|---|---|---|---|---|---|
| 0 | 0000 | 0 | 0 | 0 | 0 | 0 | 0 | 0 | 0 | 0 | 1 | $V_1$ | 2.0V |
| 1 | 0001 | 0 | 0 | 0 | 0 | 0 | 0 | 1 | 0 | 1 | 1 | $1/4(V_2-V_1)+V_1$ | 2.2V |
| 2 | 0010 | 0 | 0 | 0 | 0 | 0 | 0 | 1 | 0 | 1 | 0 | $1/2(V_2-V_1)+V_1$ | 2.4V |
| 3 | 0011 | 0 | 0 | 0 | 0 | 0 | 0 | 1 | 1 | 1 | 0 | $3/4(V_2-V_1)+V_1$ | 2.6V |
| 4 | 0100 | 0 | 0 | 0 | 0 | 0 | 0 | 0 | 1 | 0 | 0 | $V_2$ | 2.8V |
| 5 | 0101 | 0 | 0 | 0 | 0 | 1 | 0 | 1 | 1 | 0 | 0 | $1/4(V_3-V_2)+V_2$ | 3.0V |
| 6 | 0110 | 0 | 0 | 0 | 0 | 1 | 0 | 1 | 0 | 0 | 0 | $1/2(V_3-V_2)+V_2$ | 3.2V |
| 7 | 0111 | 0 | 0 | 0 | 0 | 1 | 1 | 1 | 0 | 0 | 0 | $3/4(V_3-V_2)+V_2$ | 3.4V |
| 8 | 1000 | 0 | 0 | 0 | 0 | 0 | 1 | 0 | 0 | 0 | 0 | $V_3$ | 3.6V |
| 9 | 1001 | 0 | 0 | 1 | 0 | 1 | 1 | 0 | 0 | 0 | 0 | $1/4(V_4-V_3)+V_3$ | 3.8V |
| 10 | 1010 | 0 | 0 | 1 | 0 | 1 | 0 | 0 | 0 | 0 | 0 | $1/2(V_4-V_3)+V_3$ | 4.0V |
| 11 | 1011 | 0 | 0 | 1 | 1 | 1 | 0 | 0 | 0 | 0 | 0 | $3/4(V_4-V_3)+V_3$ | 4.2V |
| 12 | 1100 | 0 | 0 | 0 | 1 | 0 | 0 | 0 | 0 | 0 | 0 | $V_4$ | 4.4V |
| 13 | 1101 | 1 | 0 | 1 | 1 | 0 | 0 | 0 | 0 | 0 | 0 | $1/4(V_5-V_4)+V_4$ | 4.6V |
| 14 | 1110 | 1 | 0 | 1 | 0 | 0 | 0 | 0 | 0 | 0 | 0 | $1/2(V_5-V_4)+V_4$ | 4.8V |
| 15 | 1111 | 1 | 1 | 1 | 0 | 0 | 0 | 0 | 0 | 0 | 0 | $3/4(V_5-V_4)+V_4$ | 5.0V |

$$Y_n = V_j + (V_i - V_j) \times \frac{R_{ON} - \Delta R}{R_{ON} + \Delta R + R_{ON} - \Delta R}$$

$$= V_j + (V_i - V_j) \times \frac{R_{ON} - \Delta R}{2R_{ON}}$$

$$= \frac{V_i + V_j}{2} - \frac{\Delta R}{2R_{ON}} \times (V_i - V_j)$$

$$Y_n = V_j + (V_i - V_j) \times \frac{R_{ON} - \Delta R + r}{R_{ON} + \Delta R + r + R_{ON} - \Delta R + r}$$

$$= V_j + (V_i - V_j) \times \frac{R_{ON} - \Delta R - r}{2(R_{ON} + r)}$$

$$= \frac{V_i + V_j}{2} - \frac{\Delta R}{2(R_{ON} + r)} \times (V_i - V_j)$$

r: CONTACT RESISTANCE

DATA DRIVER CIRCUIT OF LIQUID CRYSTAL DISPLAY FOR ACHIEVING DIGITAL GRAY-SCALE

BACKGROUND OF THE INVENTION

1. Field of the invention

The present invention relates to a display panel driver circuit for controlling and driving a plurality of liquid crystal display elements forming a display panel, and more particularly, to a data driver circuit of a liquid crystal display panel that achieves a digital gray-scale display.

2. Description of the Related Art

In recent years, active-matrix-type liquid crystal color displays, such as thin film transistor (TFT) liquid crystal color display units realizing an excellent image quality have been marketed. The TFT liquid crystal color display units are expected to afford, in the future, a large display capacity, multicolor (8/16 colors) for personal computers, and full color for television sets.

A display panel driver circuit for driving and controlling such a large scale liquid crystal color display unit of large display capacity employs a driver IC for an STN (super-twisted nematic) mode for the multicolor display, and an analog driver IC for the full color display. It will be necessary to make the circuit scale of these driver ICs compact and simple, to form a display panel driver circuit that is capable of displaying a high-quality image with gray-scales and colors(full color).

SUMMARY OF THE INVENTION

The object of the present invention is to provide a data driver circuit of a liquid crystal display that can realize a larger number of output gray-scale voltages than the number of input gray-scale voltages, without fluctuating the output voltages.

According to a first aspect of the present invention, a data driver circuit of a liquid crystal display compreses a plurality of power source voltage terminals having respective, different potential (voltage) levels, an output terminal for providing a voltage to a display panel according to voltages applied through the voltage terminals, a plurality of parallel analog switches having load resistances and disposed between the voltage terminals and the output terminal, and a selection circuit for selectively turning ON one or a plurality of the analog switches according to the input signal. This data driver circuit may contain additional resistances respectively connected in series with the analog switches.

According to a second aspect of the present invention, a data driver circuit of a liquid crystal display is composed of a plurality of power source voltage terminals having respective different voltage levels, an output terminal for providing a voltage to a display panel according to voltages applied through the voltage terminals, a respective group of parallel analog switches having load resistances and disposed between each voltage terminal and the output terminal, and a selection circuit for selectively turning ON one or a plurality of the analog switches according to the input signal. This data driver circuit may contain additional resistances respectively connected in series with the analog switches.

According to the first aspect of the present invention, one or a plurality of the analog switches connected to the power source voltage terminals having respective, different voltage levels is selectively turned ON, so that the load resistances of the turned ON analog switches divide the power source voltages and provide a larger number of output voltages than the number of the power source voltages. This simple circuit arrangement can drive a display panel with gray-scales. And the additional resistances can suppress a fluctuation in the output voltage even if the load resistances of the analog switches are stipulated.

According to the second aspect of the present invention, a plurality of the analog switches are provided for each of the voltage terminals. One or a plurality of the analog switches is selectively turned ON, and a plurality of the power source voltages are divided by the load resistances of the turned ON analog switches. As a result, compared, to the prior art and in accordance with one aspect of the present invention, this invention realizes the same number of gray-scales with a smaller number of power source voltage terminals. Also, with the same circuit size as that of prior art, this invention can realize more gray-scales. And the additional resistances can suppress a fluctuation in the output voltage even if the load resistances of the analog switches fluctuate.

In this way, the invention minimizes fluctuations in voltage levels and achieves a gray-scale multicolor (full color) display control to provide high-quality images.

BRIEF DESCRIPTION OF THE DRAWINGS

The present invention will be more clearly understood from the description as set forth below with reference to the accompanying drawings, wherein:

FIG. 7 is a table explaining the problems of the digital data driver circuit of the prior art.

FIG. 11 is a table showing the relationship between input data, applied voltage and output voltage for the digital data driver circuit of FIG. 9B;

FIG. 15 is a table showing the relationship between input data, applied voltage and output voltage for the digital data driver circuit of FIG. 13;

FIG. 20 is a table showing the relationship between input data, applied voltage and output voltage at the digital data driver circuit in FIG. 18;

DESCRIPTION OF THE PREFERRED EMBODIMENTS

Before describing the preferred embodiments, an explanation will be given of the conventional data driver circuit of the liquid crystal display as shown in FIGS. 1 to 7 and FIGS. 8A and 8B.

Figure 1:
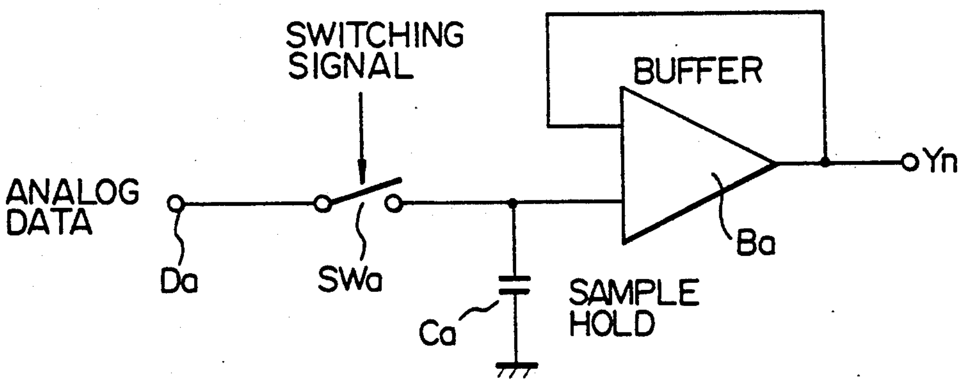
Fig. 1 PRIOR ART
FIG. 1 is a prior art circuit diagram of an analog data driver of a liquid crystal display.

FIG. 1 is a circuit schematic of a conventional analog data driver circuit employable as an analog data driver for driving a liquid crystal display panel, having an analog data input terminal Da, an ON/OFF switch SWa, a sample hold capacitor Ca, a buffer Ba, and an output terminal Yn. When a switching signal is input to the switch SWa, the switch turns ON and the analog data applied on the input terminal Da is sample held by the capacitor Ca. The held analog data is output at the output terminal Yn by the buffer Ba and the gray-scale of the liquid crystal display is determined by the level of the analog data. Usually a plurality of analog data driver circuits as shown in FIG. 1 are built in an IC chip.

The conventional analog data driver circuits having the above-mentioned arrangement share the following problems.

Figure 2:
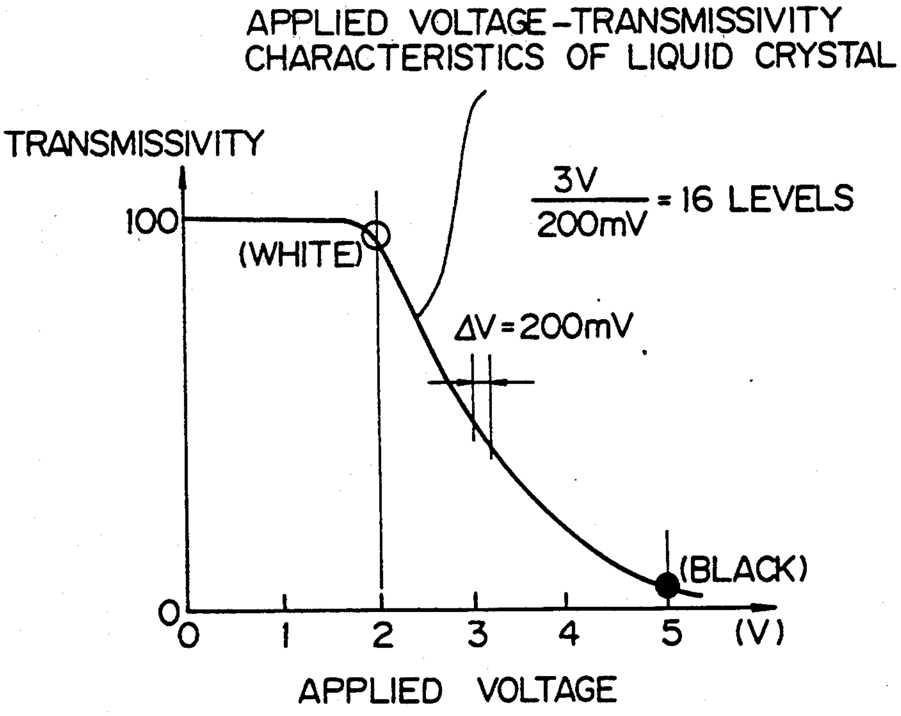
Fig. 2 PRIOR ART
FIG. 2 is a graph showing the applied voltagetransmission characteristics of liquid crystal and the maximum number of gray-scales due to fluctuations in the level of the output voltage; of an analog data driver.

First, the actual number of gray-scales of the analog driver circuit is limited to about 16 because the analog output voltages fluctuate between IC chips when displaying an image in full color. Namely, as shown in FIG. 2, usually a fluctuation in the output voltages $\Delta V$ between IC chips is 200 mV, and if the voltage difference between the respective levels of the applied voltages for producing white and black levels of the liquid crystal display is 3 V, the number of gray-scales is 3 V/200 mV=15. In addition, the analog circuit portion occupies a large area and contributes to an increase in the size of each chip and the cost of ICs.

Figure 3:
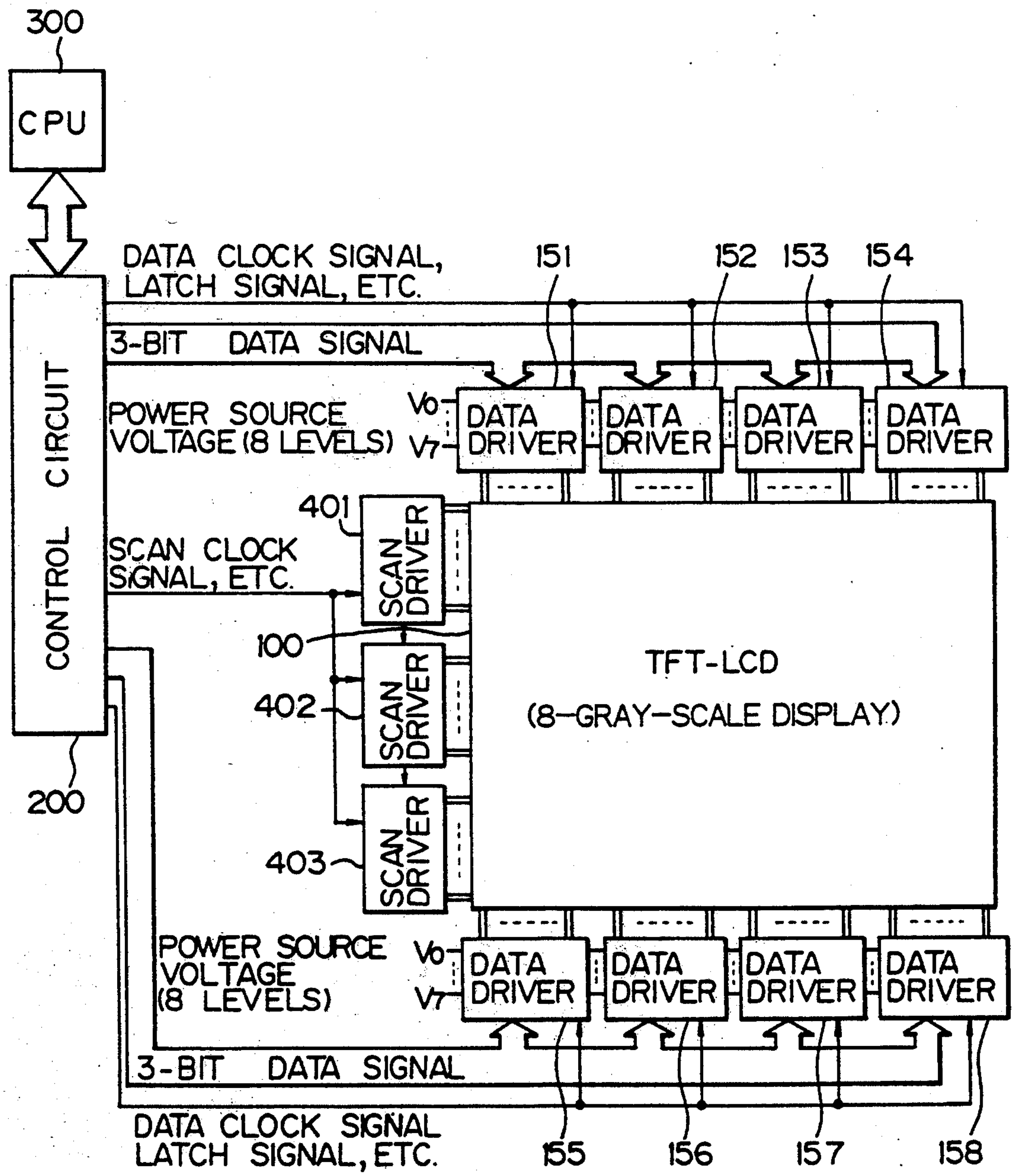
FIG. 3 is a general block diagram of the construction of a conventional liquid crystal display panel and display panel drivers.

To solve the above-mentioned problems, a digital data driver circuit is suggested. The digital data driver circuit serving as this kind of conventional display panel driver circuit will be explained with reference to FIGS. 3, 4, 5 and 6. FIG. 3 is a schematic general block diagram of the construction of an ordinary display panel of the TFT-type LCD (liquid crystal display) and display panel drivers including digital data drivers, FIG. 4 is a digital driver circuit showing a part of the conventional digital data driver in FIG. 3, FIG. 5 is a table showing the relationship between input data, applied voltage and output voltage at the digital data driver circuit in FIG. 4 and FIG. 6 is a view schematically showing the part of the digital data driver circuit in FIG. 4.

In FIG. 3, reference numeral 100 denotes a TFT-LCD, reference numerals 151 to 158 denote conventional digital data drivers serving as a display panel driver circuits for driving the TFT-LCD 100 that is capable of displaying an image with 8 gray-scales, reference numeral 200 denotes a control circuit, reference numeral 300 denotes a CPU (Central Processing Unit), and reference numerals 401 to 403 denote scan drivers for scanning horizontal electrodes of the TFT-LCD 100. To drive the TFT-LCD 100, a data clock signal, a latch signal, etc. and three bit data signals are applied to the data drivers 151 to 158, and a scan clock signal, etc. are applied to the scan drivers 401 to 403. Further, eight levels of power source voltage V0–V7 are also applied to the data drivers 151 to 158.

Figure 4:
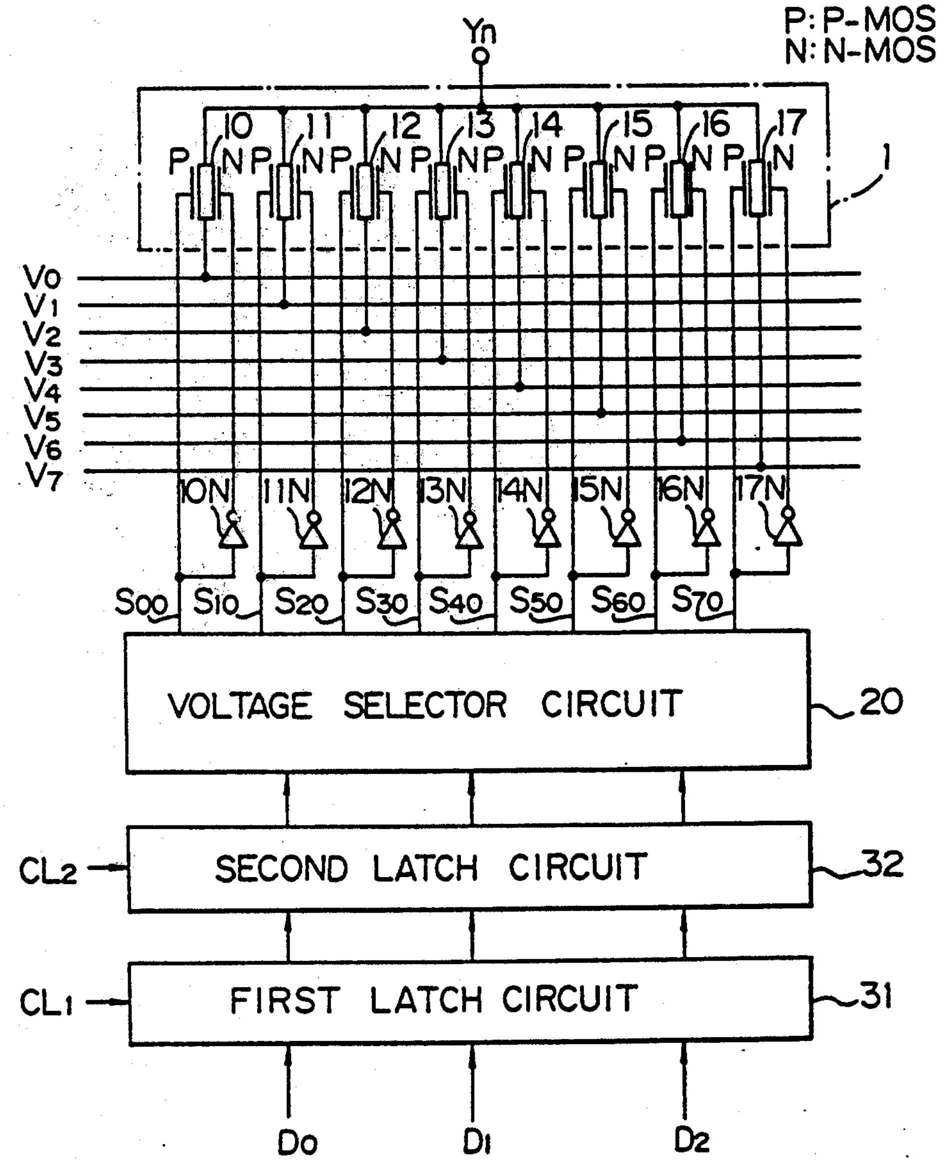
Fig. 4 PRIOR ART
FIG. 4 is a circuit diagram of a prior art digital data driver employed in FIG. 3.
Figures 5, 6:
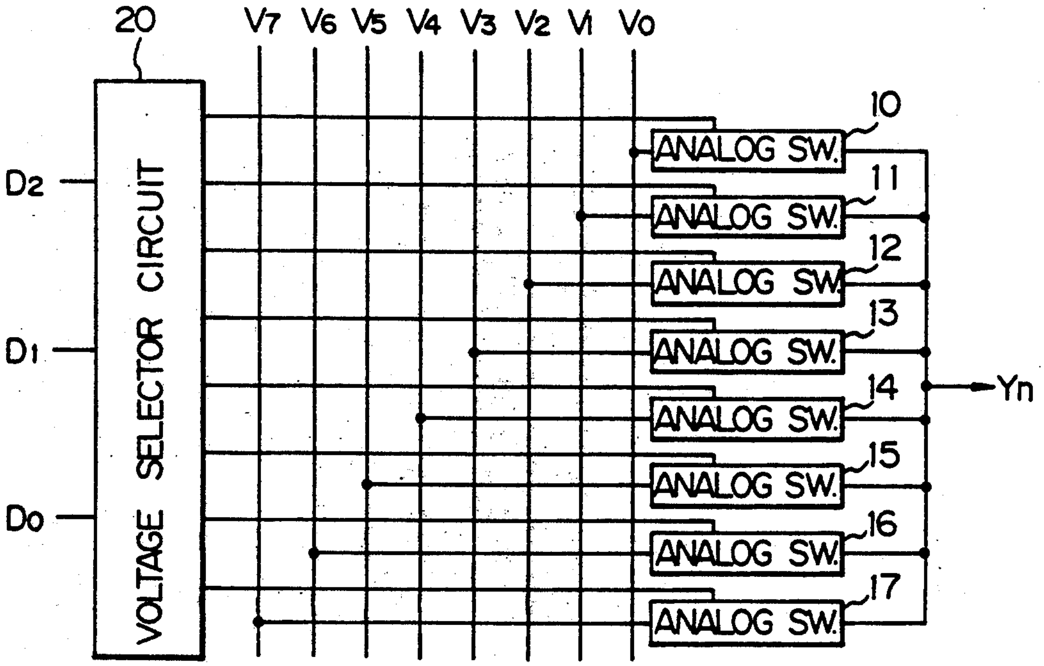
Fig. 5 PRIOR ART
Fig. 6 PRIOR ART
FIG. 5 is a table showing the relationships between input data, applied voltage and output voltage for the digital data driver circuit of FIG. 4.
FIG. 6 is a schematic of a part of the digital data driver circuit of FIG. 4.

FIG. 4 shows the conventional digital data driver circuit serving as a display panel driver circuit for driving a TFT-LCD 100 (FIG. 3) that is capable of displaying an image with 8 gray-scales comprising first and second latch circuits 31 and 32, each for holding a data signal of three bits D0 to D2 according to respective clock signals CL1 and CL2 provided by the control circuit 200 (FIG. 3); a voltage selector circuit 20 for providing, according to the data signal of three bits D0 to D2 provided by the first and second latch circuits 31 and 32, voltage selection signals S00 to S70 for selecting respective ones of the of power source voltages V0 to V7; inverters 10N to 17N for inverting the voltage selection signals S00 to S70 provided by the voltage selector 2 and providing inverted selection signals *S00to *S70 at their respective outputs (not labelled in FIG. 4 shown); and a switching circuit 1 having a plurality of analog switches 10 to 17 each having a p-channel MOS (P-MOS) FET and an n-channel MOS (N-MOS) FET, which are connected in parallel to each other and one Of them is driven according to the voltage selection signals S00 to S70 and inverted selection signals *S00 to *S70, for selecting a corresponding one of the power source voltages V0 to V7 according to the analog switches 10 to 17, and providing the selected power source voltage through an output terminal Yn.

Next, an operation of the conventional display panel drivers in FIG. 3 and the digital data driver circuit in FIG. 4 having the above-mentioned arrangement will be explained.

According to instructions from the CPU 300, the control circuit 200 provides the data drivers 151 to 158 with respective parallel data signals of each of three bits 000 to 111, data clock signals CL1 and CL2, and latch signals, etc. and selectively provides one of the scan drivers 401 to 403 with a scan signal of one horizontal line.

In each of the data drivers 151 to 158, the first latch circuit 31 selectively holds or provides (i.e., outputs) the data signal of three bits 000 to 111 according to the clock signal CL1, and the second latch circuit 32 receives the data signal of three bits 000 to 111 provided thereto by the first latch circuit 31 and selectively holds or provides the same according to the clock signal CL2.

The data signal of three bits 000 to 111 provided by the second latch circuit 32 is received by the voltage selector circuit 20, which drives and controls the analog switches 10 to 17 of the switching circuit 1, such that the thereby designated one of the power source voltages V0 to V7 is selected and provided (i.e., output) according to the characteristics of the output voltages as shown in FIG. 5. According to the ON and OFF operations of the analcg switches 10 to 17, one of the power source voltages V0 to V7 is selected and provided to the TFTLCD 100 of FIG. 3 through the output terminal Yn (FIG. 4), thereby controlling the TFT-LCD 100 with eight gray-scales. The analog switches 10 to 17 are turned ON or OFF when the corresponding one of the P-MOSFET or N-MOSFET devices in each of the analog switches is driven according to the voltage level of the corresponding one of the power source voltages V0 to V7 to which the switch is connected and which is applied to the transistors.

FIG. 6 is a schematic view showing the conventional digital data driver circuit explained above. The digital data driver circuit produces no fluctuation in the output voltage, unlike the analog driver circuit. The digital data driver circuit, however, as shown in FIG. 7, inevitably increases the number of gates and chip area ( = input voltages and analog switches) as the number of gray-scales increases thereby drastically increasing the required size of a chip. Accordingly, the number of gray-scales is limited to about 8 in the digital data driver circuit.

Further, if a load resistance value (an ON-state resistance value) of the analog switch fluctuates, the output voltage thereof also fluctuates and incorrectly displays gray-scales. The ON-state resistance for a given chip fluctuates by an amount ( ±10%) which depends on the input voltage.

Figure 8A:
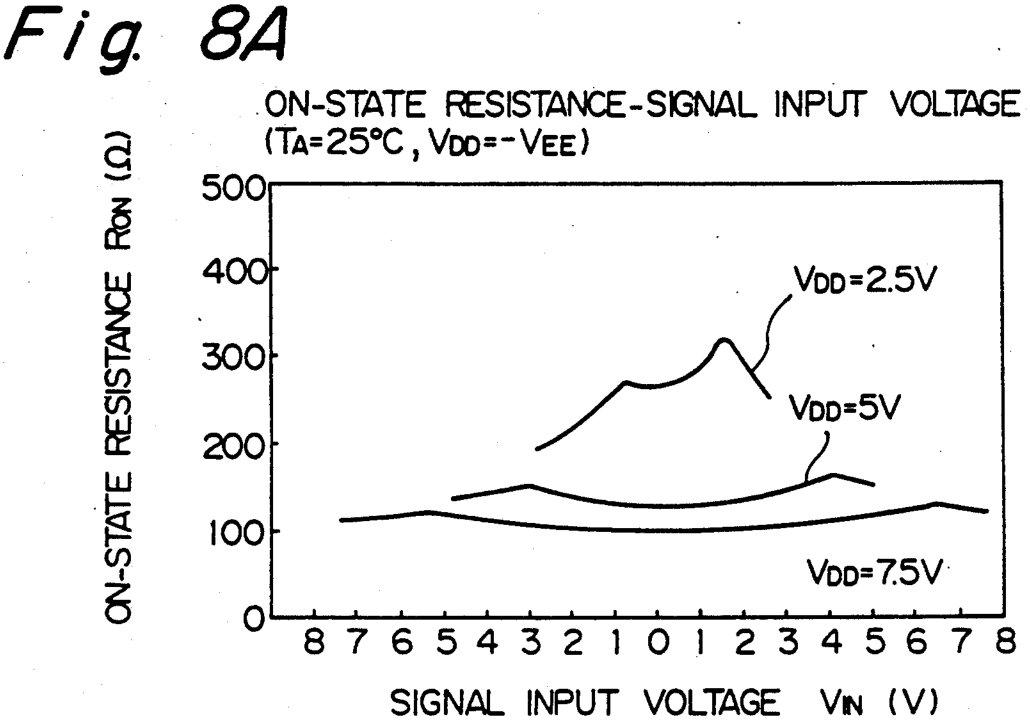
FIG. 8A is a graph showing the input voltage dependency of an ON state resistance value of an analog switch with respect to the parameter of source voltage.
Figure 8B:
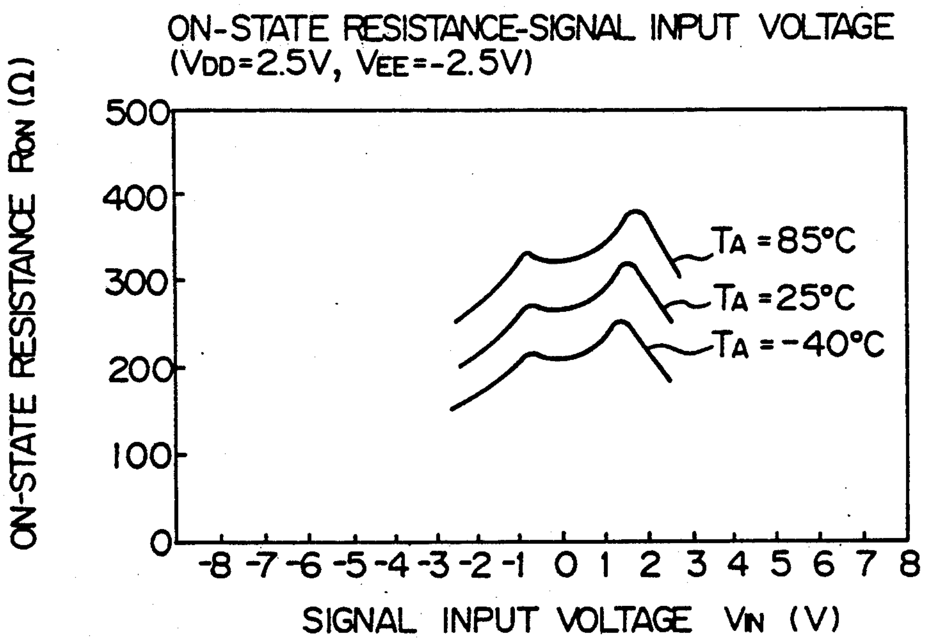
FIG. 8B is a graph showing the input voltage dependency of an ON-state.. resistance value of an analog switch with respect to the parameter of ambient temperature.

FIGS. 8A and 8B show an example of the input voltage dependency of the ON-state resistance. Particularly, FIG. 8A is a graph showing the input voltage dependency of the ON-state resistance value of an analog switch with the parameter of (i.e., as a function) source voltage $V_{DD}$, and FIG. 8B is a graph showing the input voltage dependency of the ON-state resistance value of an analog switch with the parameter (i.e., as a function) of ambient temperature $T_A$. According to the analog switch shown in FIGS. 8A and 8B, the ON-state resistance fluctuates in a range of 200 Ωto 300 Ω when the power source voltage is ±2.5 V.

Figure 9A:
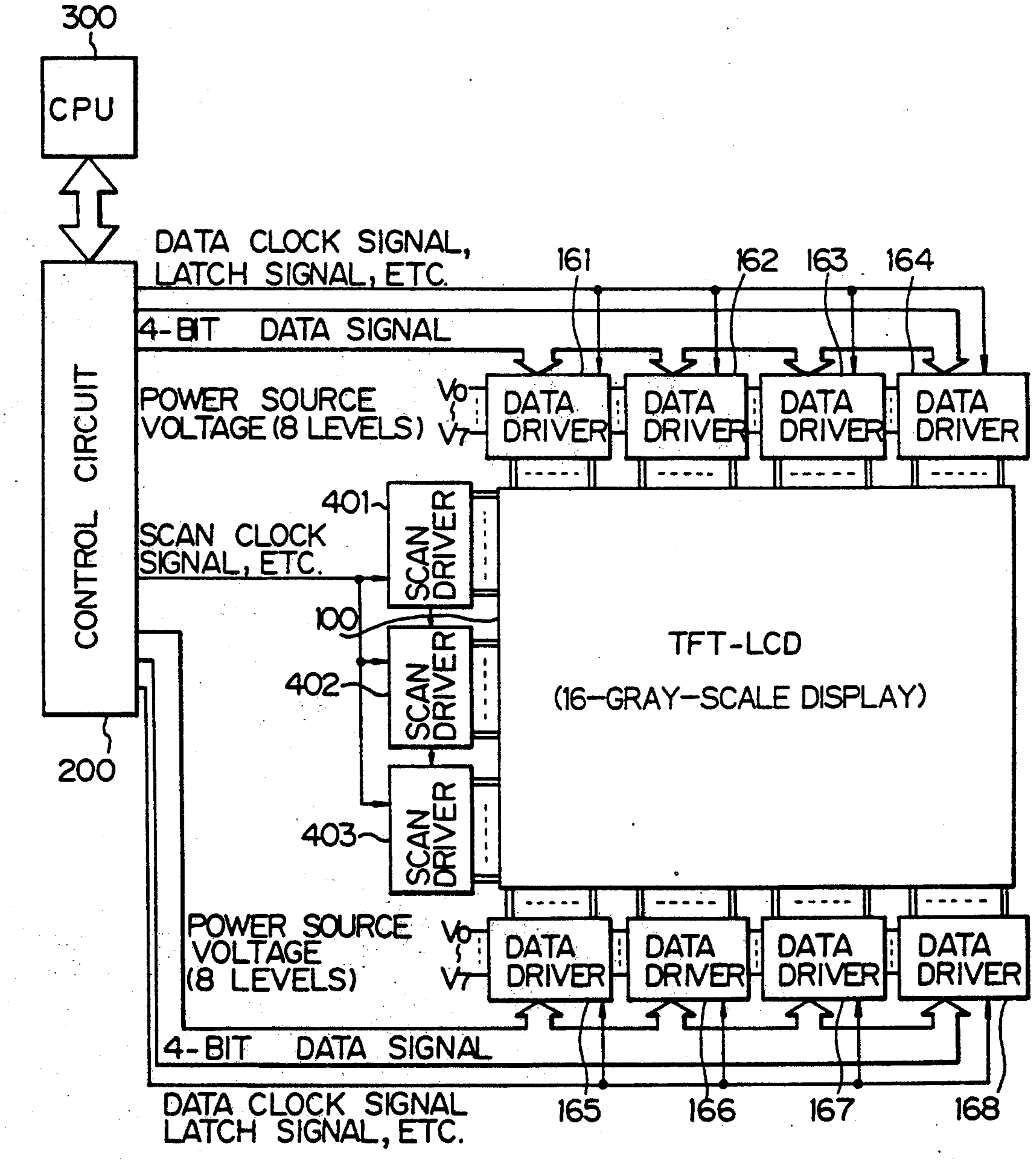
FIG. 9A is a general block diagram of the construction of a display panel and display panel drivers of the present invention.
Figure 9B:
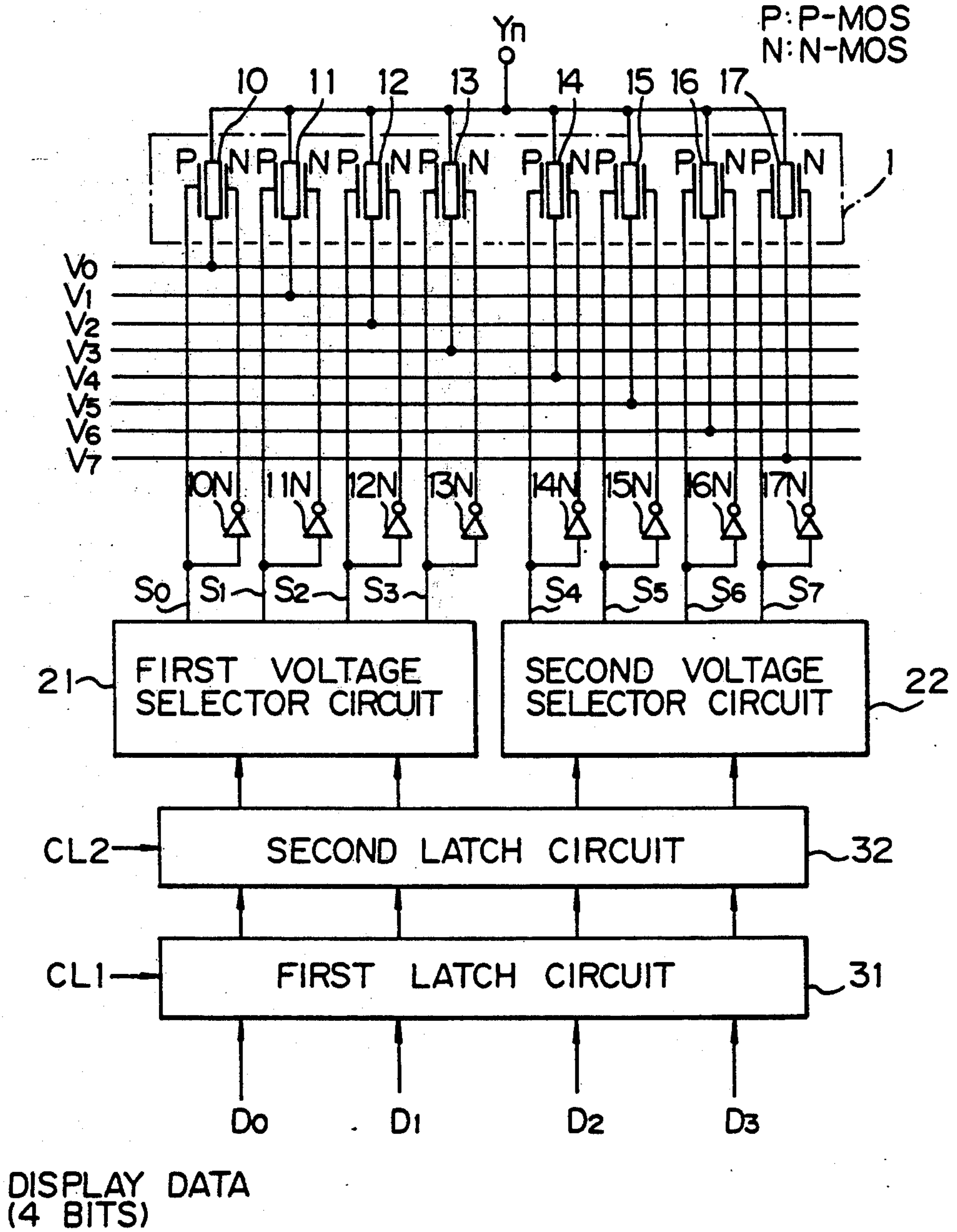
FIG. 9B is a circuit diagram showing a first embodiment of a digital data driver circuit employable as a driver in FIG. 9A according to the present invention.

FIGS. 9A is a schematic block diagram of the construction of a display panel of the TFT-type LCD and display panel drivers including digital data drivers of the present invention, and FIG. 9B is a schematic of the digital data drivers of a first embodiment of the present invention.

In FIG. 9A, reference numeral 100 denotes a TFT-LCD, reference numerals 161 to 168 denote digital data drivers of the present invention, each serving as a display panel driver circuit, for driving a TFT-LCD 100 that is capable of displaying an image with 16 gray-scales, reference numeral 200 denotes a control circuit, reference numeral 300 denotes a CPU, and reference numerals 401 to 403 denote scan drivers for respective scanning horizontal electrodes of the TFT-LCD 100. To drive the TFT-LCD 100, a data clock signal, a latch signal, etc. and four bit data signals are applied to the data drivers 161 to 168, and a scan clock signal, etc. are applied to the scan drivers 401 to 403. Further, eight levels of power source voltage V0–V7 are also commonly applied to the data drivers 161 to 168.

FIG. 9B shows the digital data driver circuit of a first embodiment of the present invention, serving as a display panel driver circuit for driving a TFT-LCD 100 (FIG. 9A) that is capable of displaying an image with 16 gray-scales and comprising, similar to the prior art of FIG. 4, first and second latch circuits 31 and 32, inverters 10N to 17N, and a switching circuit 1. In addition, the first embodiment compreses a first voltage selector circuit 21 for receiving two data signals D0 and D1, of the four bit data signals D0 to D3 provided by the second latch circuit 32, and generating the four selection signals S0 to S3 in accordance with the values of the two bits (00 to 11) of the D0 and D1 signals, to selectively turn ON one of the analog switches 10 to 13 of the switching circuit 1, and a second voltage selector circuit, 22 for receiving two data signals D2 and D3, of the four data signals D0 to D3, and generating four selection signals S4 to S7 in accordance with the values of the two bits (00 to 11) of the D2 and D3 signals, to selectively turn ON one of the analog switches 14 to 17 of the switching circuit 1.

The analog switches 10 to 17 each may have two transistors, having different conduction types and connected in parallel between the voltage terminals V0 to Vn and the output terminal Yn, and a respective voltage selection signal provided by the corresponding output of the associated selection circuit 2 and an inverted signal corresponding to the voltage selection signal generated by the respectively associated one of the inverters 10N to 17N are supplied respectively to the control terminals of the two transistors having different conduction types.

Next, an operation of the display panel drivers in FIG. 9A and the digital data driver circuit in FIG. 9B having the above-mentioned arrangement will be explained.

At first, similar to the prior art of FIG. 3, a CPU 300 instructs a control circuit 200 to provide the respective display panel driver circuits with the fourbit data signal, data clock signal, latch signal, etc. The display panel driver circuits also receive power source voltages V0 to V7 of eight levels from a power source (not shown).

As shown in FIG. 9B, in each of the display panel driver circuits that receives the signals and power source voltages, the second latch circuit 32 provides the data signals D0 and D1 to the first voltage selector circuit 21, which provides the selection signals S0 to S3 of four bits to the analog switches 10 to 13. The second latch circuit 32 provides the data signals D2 and D3 to the second voltage selector circuit 22, which provides the selection signals S4 to S7 of four bits to the analog switches 14 to 17. The analog switches 10 to 13 and 14 to 17 also receive inverted selection signals *S0 to *S3 and *S4 to *S7 (not labelled), respectively, obtained by inverting the selection signals of four bits S0 to S3 and S4 to S7 by inverters 10N to 13N and 14N to 17N, respectively.

For example, when the data signals D0 and D1 are "00", the first voltage selector circuit 21 provides the selection signals S0 to S3 of "1000" to the analog switches 10 to 13, and when the data signals D2 and D3 are "00", the second voltage selector circuit 22 provides the selection signals S4 to S7 of "1000" to the analog switches 14 to 17. The selection signals S0 to S3 and S4 to S7 of four bits "1000" and "1000" and the inverted selection signals *S0 to *S3 and *S4 to *S7 of four bits "0111" and "0111" are received as parallel signals by the analog switches 10 to 17 among which an N-MOSFET of the analog switch 10 and a P-MOSFET of the analog switch 14 are turned ON.

Figure 10A:
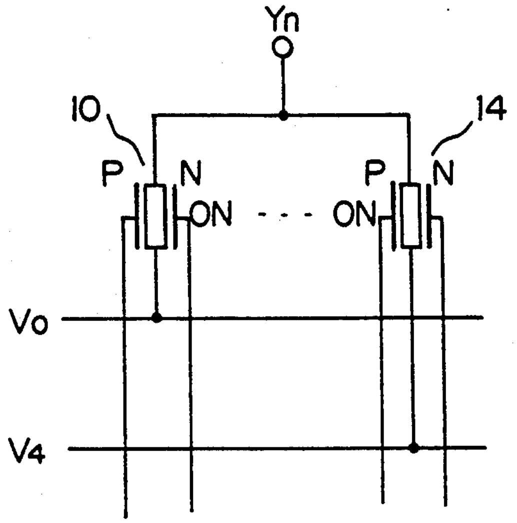
FIG. 10A is a schematic explaining an operation of an essential part of the first embodiment according to the present invention.
Figure 10B:
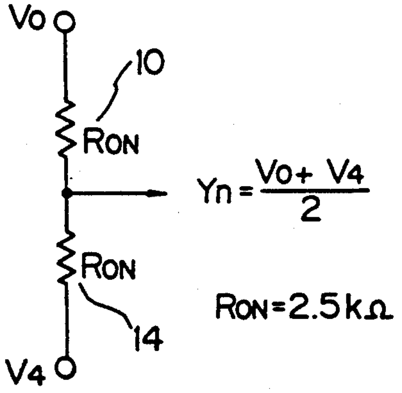
FIG. 10B is an equivalent circuit of FIG. 10A schematic explaining an operation of the first embodiment according to the present invention.

FIG. 10A is schematic circuit diagram illustrating the analog switch 10 and 14 when turned ON and FIG. 10B is an equivalent circuit of FIG. 10A explaining an operation thereof. The two turned ON analog switches 10 and 14 divide an added (i.e., summation) voltage V0+V4 of the power source voltages V0 and V4 by an ON-state resistance Ron of the load resistance of each of the analog switches 10 and 14 into a voltage (V0+V4)/2, and provided same at an output terminal Yn as shown in FIG. 10B. The ON-state resistance Ron of each of the analog switches 10 and 14 is formed when the P-MOSFET and N-MOSFET act as load elements through a depletion operation.

In this way, the data signals of four bits D0 to D3 are divided into the data signals D0 and D1 and the data signals D2 and D3, and according to the divided data signals D0 and D1, and D2 and D3, two of the analog switches 10 to 17 are selected and turned ON, so that 16 levels of power source voltages that are greater in number than the eight levels of the input power source voltages V0 to V7 are provided through the output terminal Yn.

Figure 12:
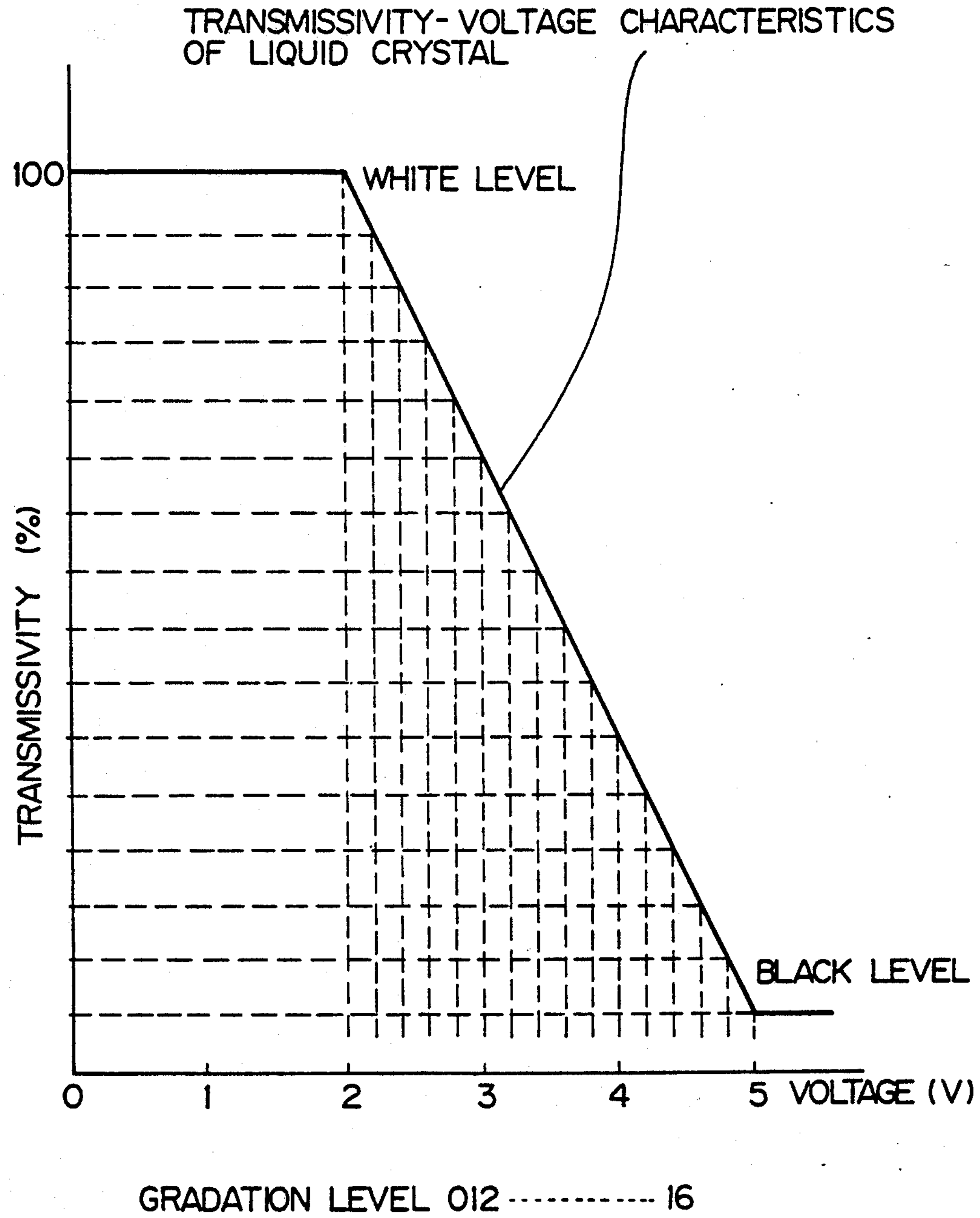
FIG. 12 is a graph showing the transmissionvoltage characteristics of liquid crystal and gray-scale levels according to the output voltage shown in FIG. 11.

When the eight input voltages are V0=2 (V), V1=2.4 (V), V2=2.8 (V), V3=3,2 (V), V4=2 (V), V5=3.6(V), V6=5.2 (V), and V7=6.8 (V), the relation among an input data, applied voltage and output voltage at the digital data driver circuit in FIG. 9B are as shown in the table of FIG. 11. FIG. 12 is a graph showing the transmission-voltage characteristics (gray-scale characteristics) of liquid crystal and gray-scale levels according to the output voltage values shown in FIG. 11. In this way, a combination of the analog switches having different ON-state resistances can realize a digital driver IC that drives many gray-scale levels with a smaller number of power sources and analog switches.

Further, under the condition that the eight input voltages are as described, the worst case of maximum power consumption and which produces the largest quantity of heat, i.e., the largest current flowing through the P-MOSFET and N-MOSFET of one of the analog switches 10 to 17, is determined as follows:

Power consumption "Pbit" for each bit:

$$\begin{aligned} Pbit &= (|V0 - V7|) \times (|V0 - V7|/2\,Ron \\ &= 4.8 \times 4.8/(2 \times 2.5) \\ &= 4.6\ (\text{mW}) \end{aligned} \tag{1}$$

Power consumption "Pchip" for each chip:

$$\begin{aligned} Pchip &= 4.6\ (\text{mW}) \times 160\ \text{bits} \\ &= 740\ (\text{mW}) \end{aligned} \tag{2}$$

A panel power consumption P per inch:

$$\begin{aligned} 10''\ \text{panel}\ P &= 4.6\ (\text{mW}) \times 640 \times 3 \\ &= 14.2\ (\text{W}) \end{aligned} \tag{3}$$

Figure 13:
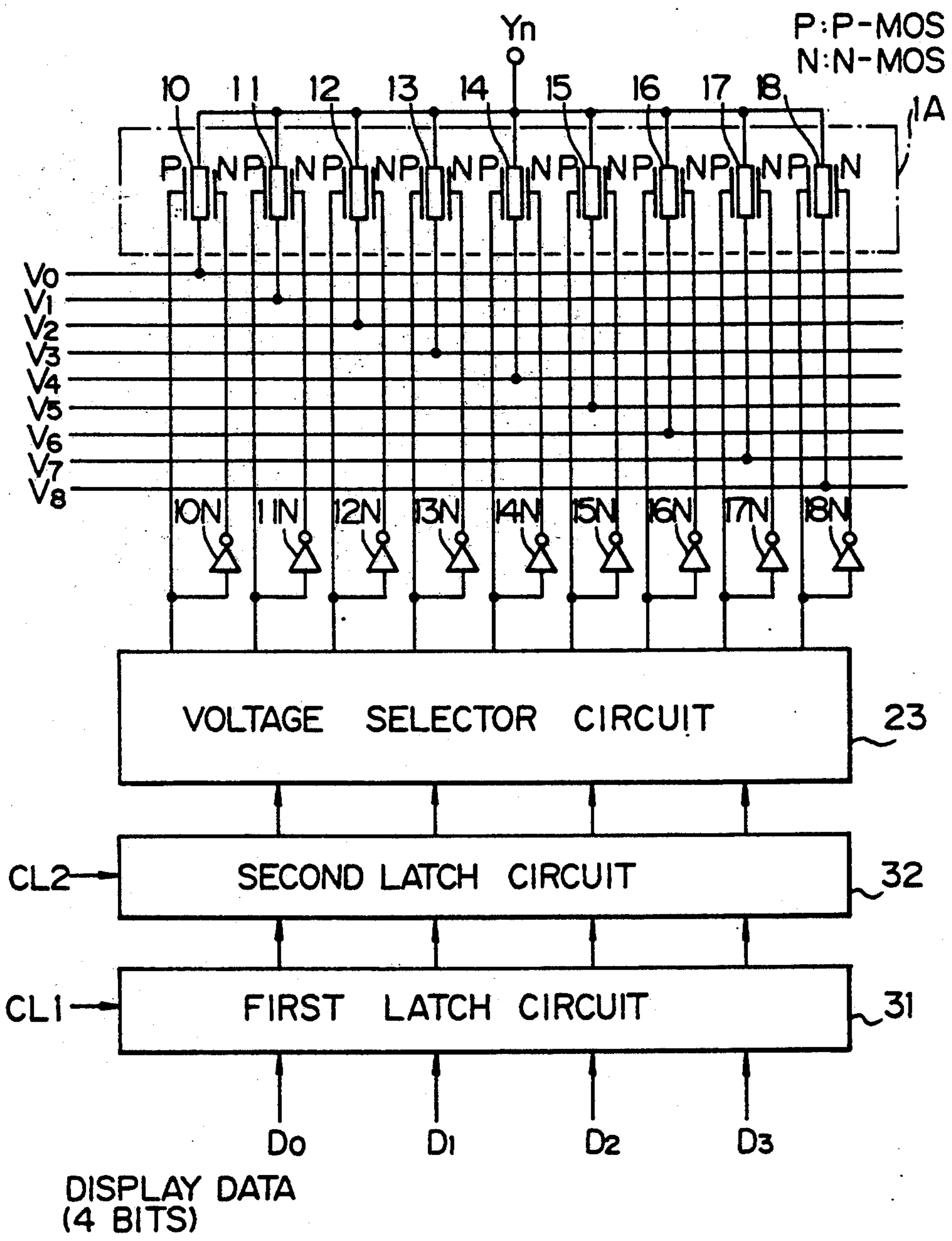
FIG. 13 is a circuit diagram showing a second embodiment of a digital data driver circuit employable as a driver in FIG. 9A according to the present invention.

FIG. 13 is a circuit diagram according to a second embodiment of the present invention. In FIG. 13, a digital data driver circuit according to the second embodiment comprises, instead of the first and second voltage selector circuits 21 and 22 and the switching circuit 1 of the embodiment of FIG. 9B, a switching circuit IA having analog switches 10 to 18, and a voltage selector circuit 23 for selectively turning ON two of the analog switches 10 to 18 corresponding to two adjacent power source voltages V0 to V8. The switching circuit 1A of this embodiment has the analog switch 18 in addition to the analog switches 10 to 17 of the switching circuit 1 of the first embodiment, and an inverter 18 N in addition to the inverters 10 N to 17 N, thereof.

An operation of the circuit of the second embodiment will be explained. Similar to the first embodiment, latch circuits 31 and 32 hold data signals of four bits D0 to D3 in response to clock signals CL1 and CL2. According to the held data signals of four bits D0 to D3, the voltage selector circuit 23 turns ON two adjacent analog switches m and m+1 (m is a natural number) to select two adjacent power voltages Vm and Vm+1 among predetermined power source voltages V0 to V8.

Figure 14A:
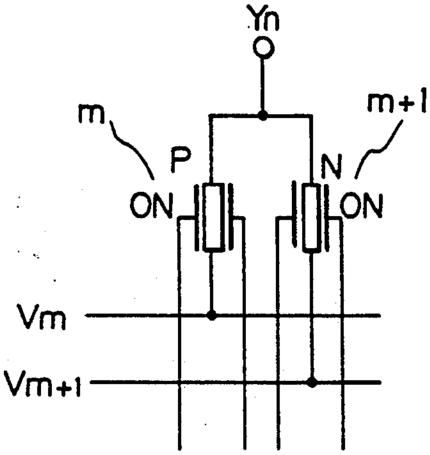
FIG. 14A is a schematic explaining an operation of an essential part of the second embodiment according to the present invention.
Figure 14B:
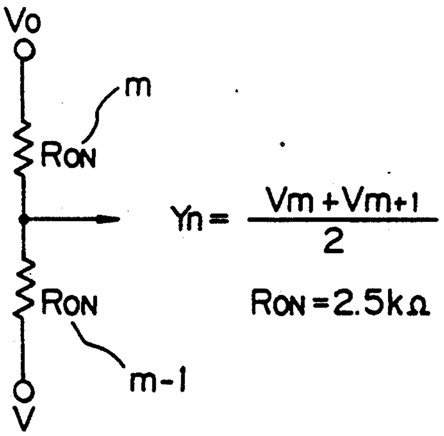
FIG. 14B is an equivalent circuit of the FIG. 14A schematic explaining an operation of the second embodiment according to the present invention.

FIG. 14A is schematic circuit diagram illustrating condition when the analog switches m and m+1 are selected to turn ON and FIG. 14B is an equivalent circuit of FIG. 14A explaining an operation thereof. The two turned ON analog switches m and m+1 divide an added (i.e., summation) voltage Vm + Vm+1 of the power source voltages Vm and Vm+1 by an ON-state resistance Ron of the respective load resistance of each of the analog switches m and m+1 into a voltage (Vm + Vm+1)/2, provided at the output terminal Yn as shown in FIG. 14B. The ON-state resistance Ron of each of the analog switches m and m+1 is produced when the P-MOSFET and N-MOSFET act as load elements through a depletion operation.

In this way, according to the data signals D0 to D3, two adjacent analog switches m and m+1 are selected from the analog switches 10 to 18 and turned ON, so that 16 levels of power source voltages that are greater in number than the eight levels of the input power source voltages V0 to V8 are provided through the output terminal Yn.

When the eight input voltages are V0=2 (V), V1=2.4 (V), V2=2.8 (V), V3=3,2 (V), V4=3.6 (V), V5=4 (V), V6=4.4 (V), V7=4.8 (V) and V8=5.2 (V), the relationship among the input data, applied voltage and output voltage at the digital data driver circuit in the table of FIG. 13 is shown in FIG. 15.

In this way, the output voltage Yn based on the two adjacent ones of the power source voltages V0 to V8 may selectively correspond to any of 16 gray-scales (actually 17 gray-scales, and 16 of them are selected), as shown in FIG. 15. Since a voltage difference between two adjacent voltages of the power source voltages V0 to V8 is 0.4 V, power consumption may be minimized by selecting adjacent voltages among the power source voltages V0 to V8. Similar to the power consumption calculation of the first embodiment (the equations (1), (2), and (3)), power consumption of this embodiment is found as follows:

Power consumption "Pbit" for each bit:

$$Pbit = (0.4\ V)^2/2\ Ron = (0.4\ V)^2/(2 \times 2.5 k\Omega) = 0.032\ (mW) \quad (4)$$

Power consumption "Pchip" for each chip:

$$Pchip = 0.032 \times 160 = 5.12\ (mW) \quad (5)$$

Panel power consumption 10" panel P for one inch:

$$10''\ panel\ P = 0.032\ mW \times 1920 = 61.4\ (mW) \quad (6)$$

In this way, this embodiment can greatly reduce the power consumption, as compared with that determined by the equations (1), (2), and (3) of the previous embodiment.

Figure 16:
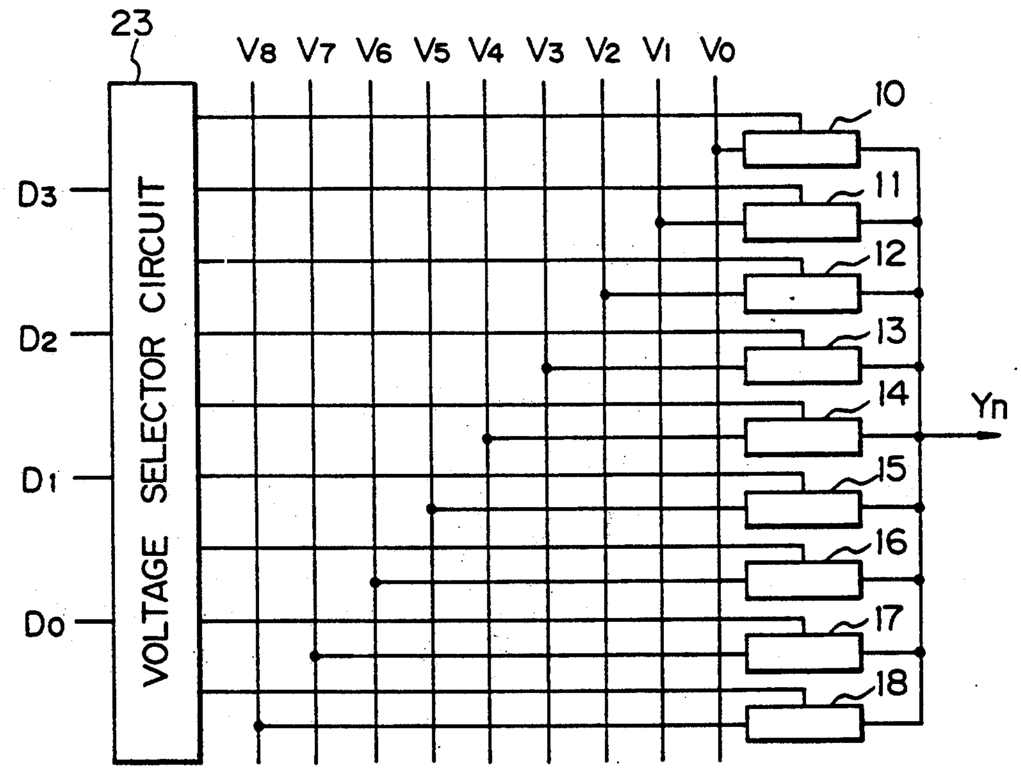
FIG. 16 is a block circuit diagram showing a part of the circuit diagram of FIG. 13.

FIG. 16 is a schematic block circuit diagram showing the second embodiment, which will be a reference block circuit diagram to be compared with the block circuit diagram of the first embodiment according to the present invention, and will appear hereinafter.

Figure 17:
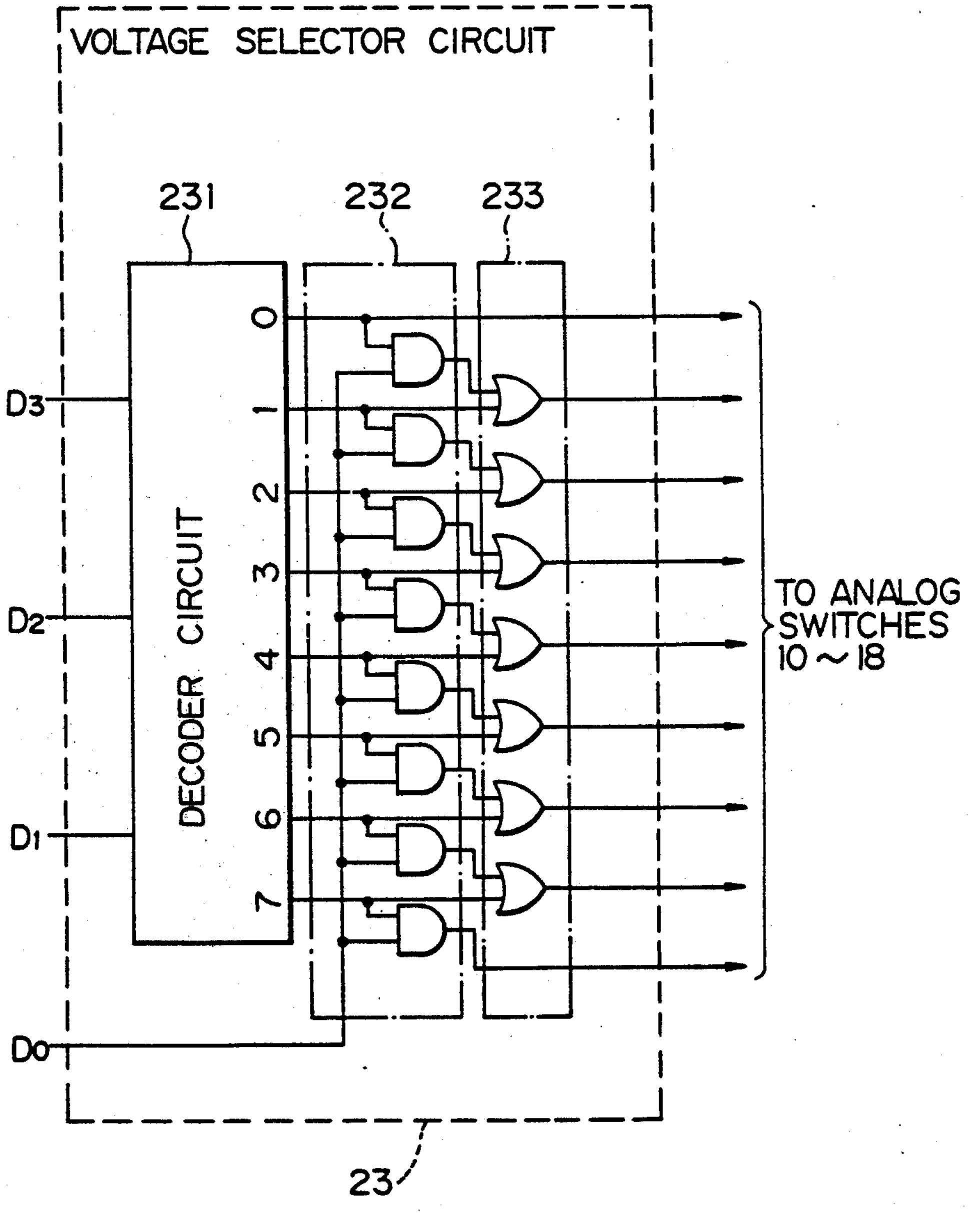
FIG. 17 is an example of a voltage selector circuit according to the present invention.

FIG. 17 is a circuit diagram showing one example of a voltage selector circuit 23 according to the present invention. In FIG. 17, the voltage selector circuit 23 comprises a decoder circuit 231 for receiving three data signals D1 to D3 and providing a selection signal of eight bits, an AND circuit 232 for providing an AND logic combination of the selection signal of eight bits and another data signal D0, and an OR circuit 233 for providing an OR logic combination of outputs of the AND circuit 232 and the selection signal of eight bits.

In each of the previous embodiments, two of the power source voltages V0 to V7 (or V8) are selected and divided. This embodiment optionally selects a plurality of the power source voltage levels, and two sets of them, or a combination of them are divided to provide a divided voltage output, thereby realizing a large number of gray-scales.

FOURTH EMBODIMENT

Figure 18:
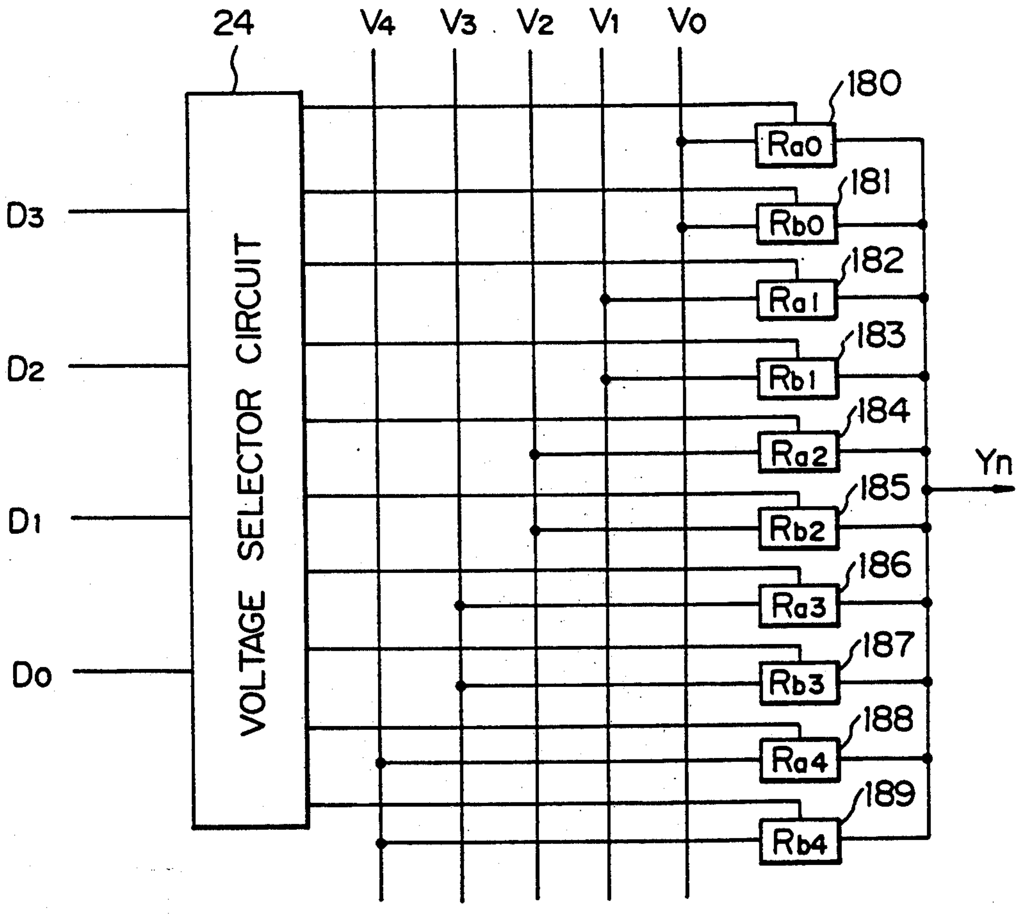
FIG. 18 is a block circuit diagram of a part of the data driver in FIG. 9A showing a third embodiment according to the present invention.

FIG. 18 is a schematic block circuit diagram showing a digital data driver circuit according to a third embodiment of the present invention. The digital data driver circuit according to this embodiment involves power source voltages V0 to V4 instead of the power source voltages V0 to V8 of the second, embodiment of FIG. 16, and two corresponding ones of the analog switches are connected to each of the power source voltages V0 to V4. For example, the two corresponding analog switches Rao and Rbo are connected to the power source voltage V0. The analog switches connected to the power source lines of different voltage levels are simultaneously turned ON to divide the power source voltages and provide more voltage levels than the five input voltage levels.

Figure 19A:
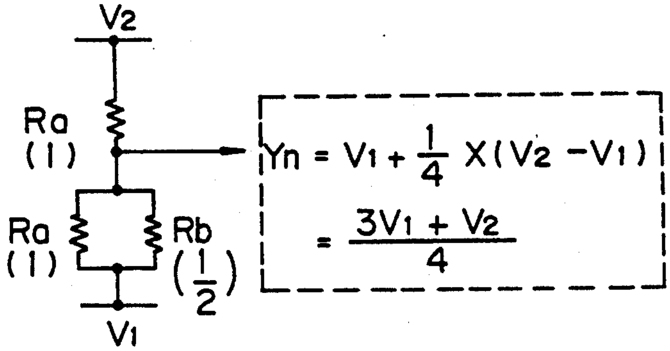
FIGS. 19A to 19C are equivalent circuits explaining an operation of an essential part of the third embodiment in FIG. 18.
Figure 19B:
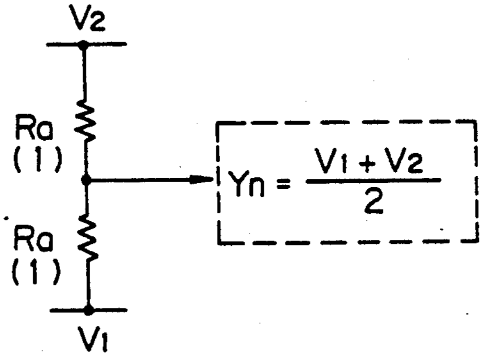
Figure 19C:
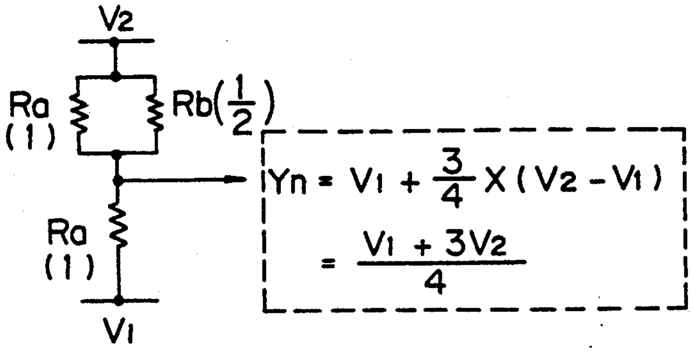

Namely, the embodiment of FIG. 18 has five power sources and two corresponding analog switches for each of the five power sources, i.e., ten analog switches 180 to 189. A ratio of ON-state resistances of each of the analog switches is set to 1:2 (Rai=2Rbi=Ron : i is 0 to 4). As shown in FIGS. 19A, 19B, and 19C, the switches may be selected in a configuration of "one piece and two pieces", "one piece and one piece", or "two pieces and one piece", to divide adjacent power source levels into three equal levels ($\frac{1}{3}$, $\frac{1}{2}$, and $\frac{2}{3}$). As a result, the five power sources and ten analog switches provide output levels for 16 gray-scales. Note that in FIG. 19A and 19C, (1) means a unit value and ($\frac{1}{2}$) means that Rb=Ra/2.

FIG. 20 shows the output voltage characteristics, i.e., the relationship between input data, 16 gray-scale levels to be achieved, analog switches to be selected, and output voltages of the five power source voltages and ten analog switches of FIG. 18. ON-state resistances of the two analog switches connected to the same power source are Rai=4 (kΩ) and Rbi=2 (kΩ). The power source voltages are 2.0 (V), 2.8 (V), 3.6 (V), 4.4 (V), and 5.2 (V). These realize voltage levels for the 16 gray-scales between a white level (2.0 (V)) and a black level (5.0 (V)) of the TFT-LCD panel.

In the third embodiment, two analog switches having different ON-state resistances are connected to the same power source voltage level. More than two analog switches may be connected to the same power source voltage level. The simultaneously selected voltage levels are adjacent voltage levels according to this embodiment. Optional voltage levels may be simultaneously selected and divided. According to this embodiment, the respective ON-state resistances of the plurality of analog switches are different from one another. These ON-state resistances may be equal to one another, and a combined value of the ON-state resistances may be changed depending on the number of analog switches to be turned ON, when dividing the power source voltages.

Figure 21:
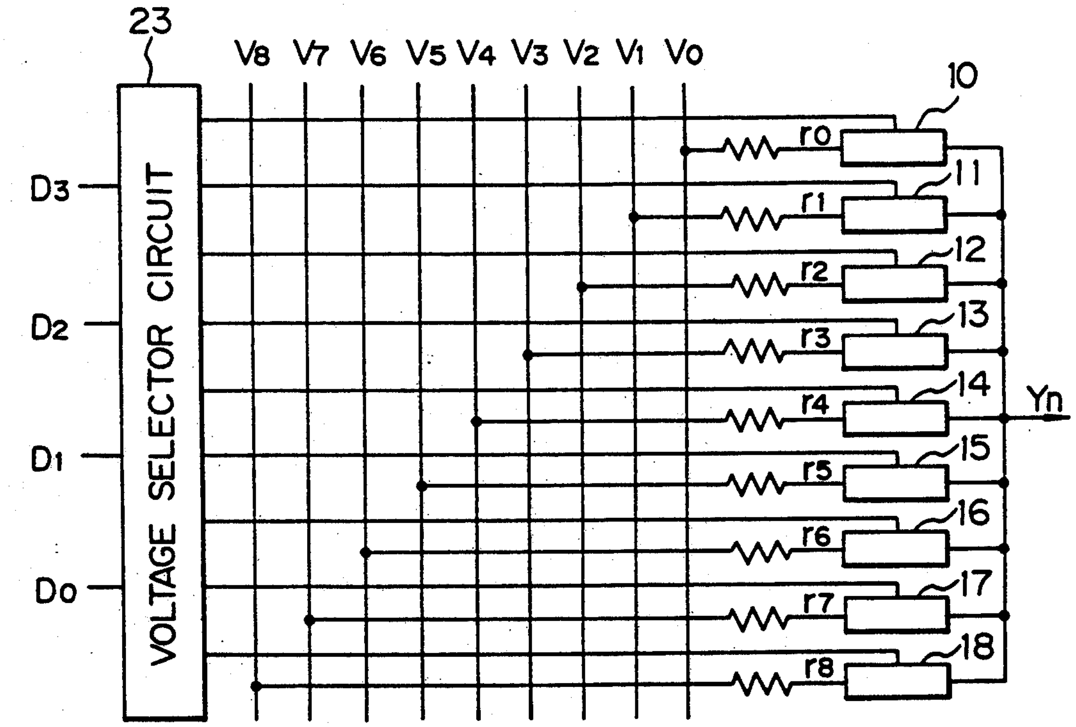
FIG. 21 is a block circuit diagram of a part of the data driver in FIG. 9A showing a fourth embodiment according to the present invention.

FIG. 21 is a schematic block circuit diagram showing a digital data driver circuit according to a fourth embodiment of the present invention. In the digital data driver circuit according to this embodiment, additional resistances r0 to r8 are connected in series between the power source line connection points and the analog switches 10 to 18 of the second embodiment of FIG. 16.

Figure 22A:
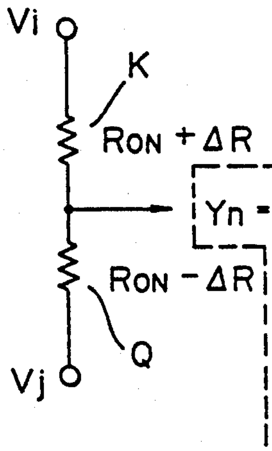
Fig. 22A PRIOR ART
FIGS. 22A and 22B are equivalent circuits explaining an operation of an essential part of the fourth embodiment in FIG. 21.
Figure 22B:
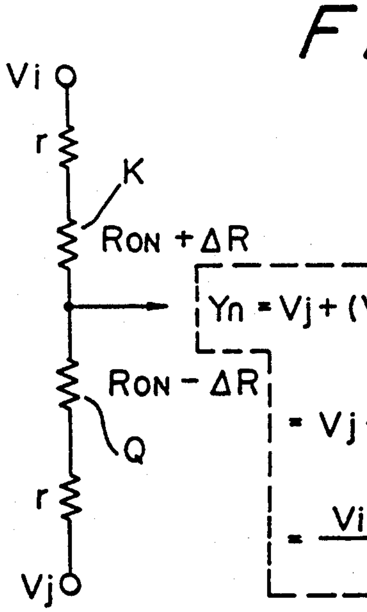

FIG. 22A and 22B are an explanatory views showing a principle of operation of this embodiment. In FIG. 22A and 22B, a prior art circuit and the circuit of this embodiment are compared with each other as to fluctuations in output voltages that are derived by simultaneously selecting two analog switches and dividing the output voltages thereof with ON-state resistances of the selected analog switches. According to the prior art of FIG. 22A, a fluctuation ΔR in the ON-state resistances of each of the analog switches appears as it is as a fluctuation in the output. On the other hand, according to the embodiment of FIG. 22B, the fluctuation in the output is substantially ignored when the additional resistance r is greater than the fluctuation ΔR in the ON-state resistance.

This embodiment can suppress a fluctuation in the ON-state resistances, reduce a fluctuation in the charging and discharging time of an added capacitance, and eliminate unevenness of display due to a fluctuation in the rising characteristics of a voltage waveform, not only when selecting two analog switches but also when selecting one analog switch.

According to the fourth embodiment of FIG. 21, the driver IC involves nine analog switches and nine power sources to realize 16 gray-scale levels. The additional resistance r is connected in series with each of the analog switches. If the ON-state resistance Ron of the analog switch is 5 (kΩ) and the fluctuation ΔR of the ON-state resistance 50%, i.e., ΔR=250(Ω), and if Vi=V (V) and Vj=0 in FIG. 22A and 22B, the prior art output voltage (FIG. 22A) will be:

$$Yn = V\times(1-R/Ron)/2 \quad (7)$$

so that the fluctuation Δ Yn in the output is:

$$\Delta Yn = -(V/2)\times(\Delta R/Ron) \quad (8)$$

The output fluctuation is therefore, 50%.

On the other hand, the output of the embodiment of FIG. 22B having the additional resistances r is:

$$Yn = V\times[1-\Delta R/(Ron+r)]/2 \quad (9)$$

so that the fluctuation ΔYn in the output is:

$$\Delta Yn = -(V/2)\times[\Delta R/(Ron+r)] \quad (10)$$

Namely, the output fluctuation is 250/(500+5000)=0.045,i.e., about 5%.

Next, a method of forming the additional resistances will be explained.

Resistances to be formed in an integrated circuit are semiconductor resistances or thin film resistances. The semiconductor resistances are classified into diffusion resistances and ion implantation resistances.

Figure 23A:
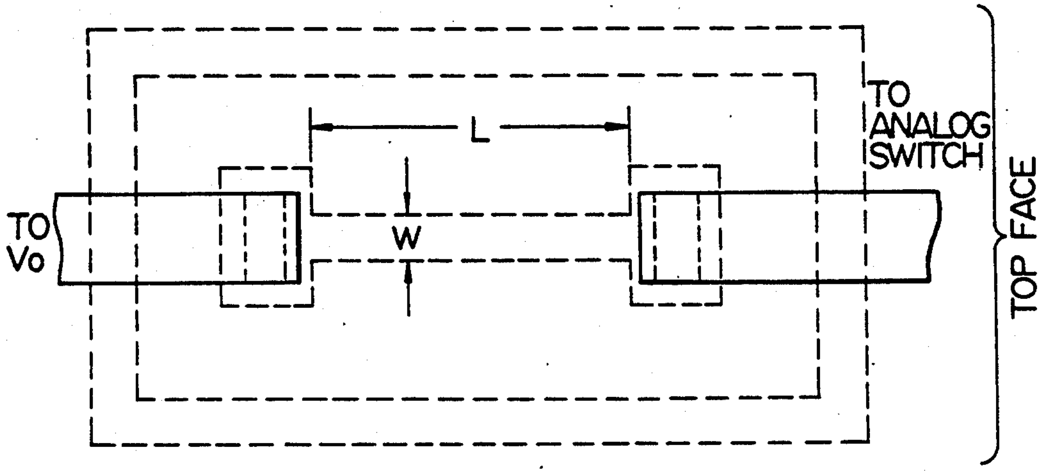
FIG. 23A is a top face view showing that the resistance in FIG. 21 is made of diffusion resistance.
Figure 23B:
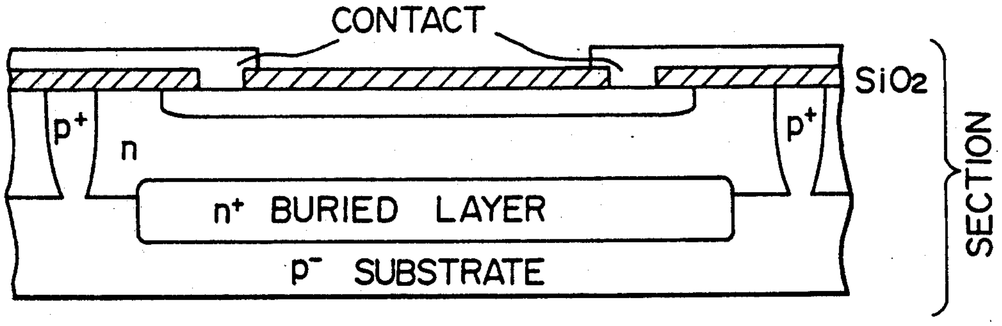
FIG. 23B is a section view of the resistance in FIG. 23A.

The diffusion resistance uses a diffusion layer for a base or an emitter. FIG. 23A shows a top face showing an element structure of the diffusion resistance using a p-type base diffusion layer of an npn transistor. FIG. 23B shows a section view of FIG. 23A. With a length L and a width W, a resistance value R is expressed as:

$$R = pL/xjW \quad (11)$$

where p is an average resistance ratio of the diffusion layer, and xj is the depth of a junction.

Figure 23C:
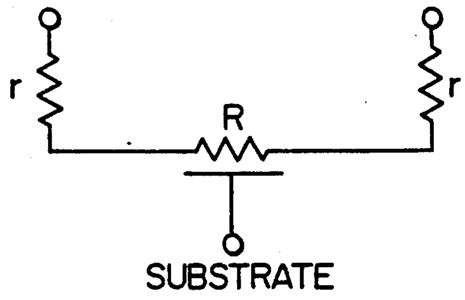
FIG. 23C is an equivalent circuit of the diffusion resistance in FIGS. 23A and 23B.

In the actual designing of a resistance, a layer resistance (or a sheet resistance) Rs=p/xj. The layer resistance is a resistance value per unit square on a plane pattern and expressed with a unit ofΩ/ square. When this expression is substitued in for the equation (11), R =Rs(L/W). The Rs is usually 50 to 250 Ω/ square for a base diffusion layer, and 2 to 10Ω/ square for an emitter diffusion layer. The former is used as a resistance of the order of kΩ, and the latter as a resistance of the order of several to 100 Ω. Since the mobility of carriers decreases according to temperature, the Rs has a positive temperature factor of about 1000 to 3000 ppm/° C. This temperature dependency of the Rs causes a temperature drift of an integrated circuit. Since the diffusion resistance is separated from a substrate by a pn junction of reverse bias, it has depletion layer capacitance due to a parasitic effect. As shown in FIG. 23C, the high-frequency equivalent circuit comprises a distributed RC circuit whose impedance decreases at a high frequency.

Figure 24:
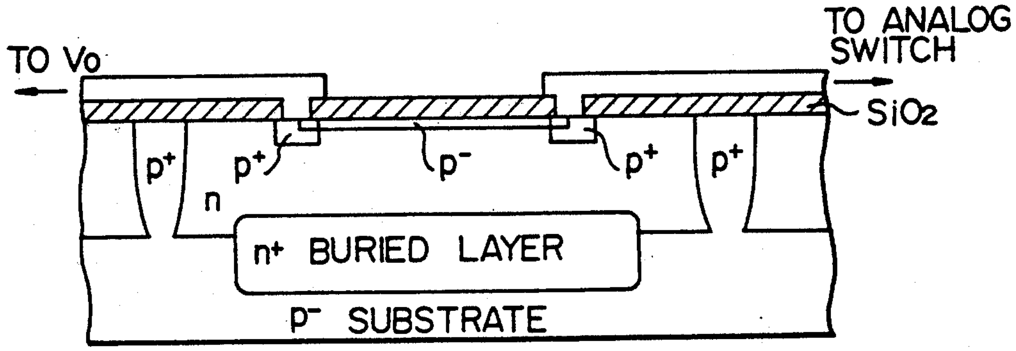
FIG. 24 is a sectional view showing that the resistance in FIG. 21 is made of an ion implantation resistance.

The ion implantation resistance is a layer resistance formed on the surface of a semiconductor by injecting impurities such as boride according to an ion implantation technique. FIG. 24 shows a sectioned structure of the ion implantation resistance. The impurities exist in a thin layer of typically 0.1 to 0.8 micrometers thick formed on the silicon surface. Namely, the ion implantation resistance is about 20 times thicker than the diffusion layer, which is 2 to 4 micrometers in thickness, and therefore the ion implantation resistance provides a high resistance value of the order of 100 k Ω.

Figure 25:
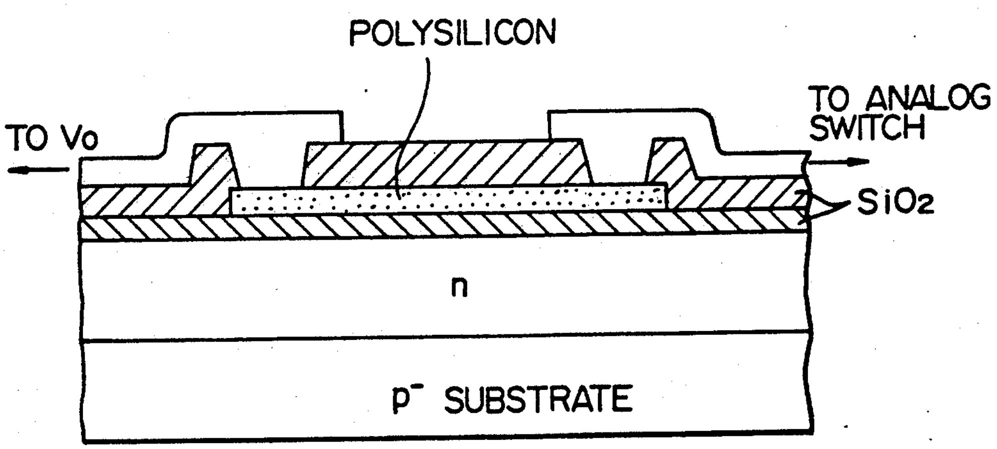
FIG. 25 is a section view showing that the resistance in FIG. 21 is made of a thin film resistance.

As shown in FIG. 25, the thin film resistance is a polysilicon film or a nichrome thin film formed on an oxide film. Since the thin film resistance has a layer resistance of 20 to 500Ω/ square, a small parasitic capacitance, and a low voltage dependency, it is easy to use. Polysilicon is frequently used in semiconductor processes and has a good affinity with an LSI. The nichrome is easily trimmed so that it is used as a load resistance for a precision D/A converter.

The diffusion resistance, ion implantation resistance, and thin film resistance used is determined according to requirements of the additional resistances and ease of preparation.

In the fourth embodiment, the additional resistances may be arranged between the power sources and the analog switches, or between the analog switches and the output.

Figure 26:
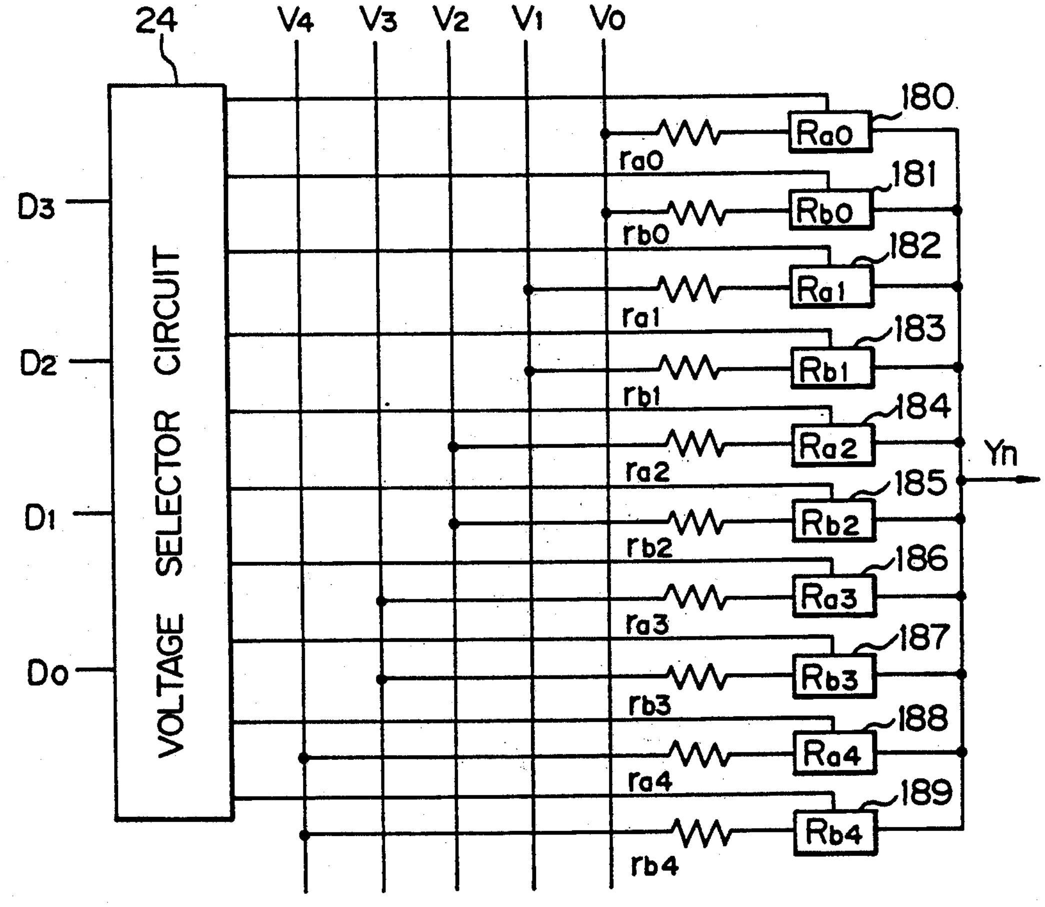
FIG. 26 is a block circuit diagram of a part of the data driver in FIG. 9A showing a fifth embodiment according to the present invention.

FIG. 26 is a schematic block circuit diagram showing a digital data driver circuit according to a fifth embodiment of the present invention. As shown in the figure, the digital data driver circuit of this embodiment comprises additional resistances ra0 to rb4 disposed between the power source lines and the analog switches 180 to 189 of the third embodiment of FIG. 18.

The principle of operation of this embodiment is the same as that of the fourth embodiment. A fluctuation in the ON-state resistances of the analog switches is minimized by the additional resistances having high resistance values.

As explained above, the present invention selectively turns ON one or a plurality of analog switches respectively connected to a plurality of power source voltage terminals having different corresponding voltage levels, and divides a plurality of the power source voltages by the load resistances of the turned ON analog switches. As a result, the number of output voltage levels becomes greater than the number of the power source voltage levels. With a simple circuit configuration and without increasing the size of the circuit, as compared with the prior art, the invention drives a display panel with more gray-scales.

In addition, the invention minimizes the fluctuation between voltage levels and the fluctuation in an ON-state resistance of each analog switch, and displays a high quality image with gray-scales and multicolor (full color).

What is claimed is:

1. A data line driver circuit providing a plurality of digitally selectable, gray-scale display drive signal outputs, of a first number, for a liquid crystal display, comprising:

plural power source voltage terminals at a second number of respective and different, plural voltage levels, the second number being less than the first number;

a driver circuit output terminal;

a plurality of analog switches with corresponding load resistances, each having an input terminal connected to a corresponding one of the power source voltage terminals, an output terminal connected to the driver circuit output terminal and associated switching terminals for receiving corresponding input ON signals, each analog switch being selectively switched to an ON condition by a corresponding input ON signal;

a source of display data signals defining the specific gray-scale value, of the first number of gray-scale values, of a display to be produced by the liquid crystal display; and a selection circuit having input terminals connected to the display data signal source for receiving the display data signals, having output terminals respectively connected to the associated switching terminals of the plurality of analog switches, and being responsive to the received display data signals for selectively generating at and transmitting from the output terminals thereof one or more input ON signals respectively to one or more of the associated input terminals of the plurality of analog switches in accordance with and in response to the specific gray-scale value defined by the received display data signals for the corresponding display to be produced, the analog switches which receive the ON signals from the selection circuit producing outputs through the corresponding load resistances thereof and thereby at the respective output terminals thereof, and which outputs are combined at the driver circuit output terminal as the thereby selected, gray-scale display drive signal output of the data line driver circuit.

2. A data line driver circuit as recited in claim 1, wherein:

the plurality of analog switches is arranged in a plurality of groups, each group comprising plural analog switches; and the selection circuit selectively transmits one or a plurality of ON signals to the corresponding one or the corresponding plurality of the analog switches of each of the plurality of groups of analog switches.

3. A data line driver circuit as recited in claim 1, wherein:

the plurality of analog switches is arranged in a plurality of groups, each group comprising plural analog switches; and the selection circuit selectively transmits one or a plurality of ON signals to the corresponding one or the corresponding plurality of the analog switches in each group of plural analog switches and wherein the respective input terminals of the corresponding plurality of analog switches of each group to which the ON signals are selectively transmitted are connected to corresponding power source voltage terminals having adjacent, different voltage level values.

4. A data line driver circuit as recited in claim 1, wherein:

each analog switch comprises first and second transistors of respective, different conductivity types having corresponding first and second control terminals and being connected in parallel between the corresponding input and output terminals of the analog switch; and the voltage selection circuit has, for each analog switch, a respective pair of first and second output terminals corresponding to the first and second control terminals of the respective first and second transistors of the analog switch and supplies, as the ON signal, a selection signal and an inverted selection signal respectively to the first and second control terminals of the first and second transistors of the analog switch in accordance with the respective, different conductivity types thereof.

5. A data line driver circuit as recited in claim 1, wherein:

the first and second transistors of each analog switch respectively comprise a P-channel MOSFET and N-channel MOSFET having respective gate terminals; and the respective control terminals of the first and second transistors comprise the respective gate terminals of the P-channel and N-channel MOSFETs.

6. A data line driver circuit as recited in claim 1, further comprising:

a plurality of resistance elements respectively connected between the input terminals of the plurality of analog switches and the corresponding power source voltage terminals.

7. A data line driver circuit as recited in claim 6, wherein:

the plurality of analog switches is arranged in a plurality of groups, each group comprising plural analog switches; and the selection circuit selectively transmits an ON signal to one or more of the plural analog switches in each of the plurality of groups of analog switches in accordance with and in response to the display data input signal.

8. A data line driver circuit as recited in claim 6, wherein:

the plurality of analog switches are arranged in a plurality of groups, each group comprising plurality switches; and the selection circuit selectively transmits one or a plurality of ON signals to the corresponding one or the corresponding plurality of the analog switches in each group of plural analog switches and wherein the respective input terminals of the corresponding plurality of analog switches of each group to which ON signals are selectively transmitted are connected to corresponding power source voltage terminals having adjacent, different voltage level values.

9. A data line driver circuit as recited in claim 6, wherein:

each analog switch comprises first and second parallel transistors of respective, different conductivity types and corresponding first and second control terminals and connected in parallel between the corresponding input and output terminals of the analog switch; and the voltage selection circuit has, for each analog switch, a respective pair of first and second output terminals corresponding to the first and second control terminals of the respective first and second transistors of the analog switch and supplies, as the ON signal, a selection signal and an inverted selection signal respectively to the first and second control terminals of the first and second transistors of the analog switch in accordance with the respective, different conductivity types thereof.

10. A data line driver circuit as recited in claim 6, wherein:

the first and second transistors of each analog switch respectively comprise a P-channel MOSFET and N-channel MOSFET; and the respective control terminals of the first and second transistors comprise the respective gate terminals of the P-channel and N-channel MOSFETs.

11. A data line driver circuit as recited in claim 6, wherein:

each analog switch, when switched to an ON-state by receipt of an ON-signal from the selection circuit, has a respective resistance value; and the resistance value of each of the plurality of resistance elements is higher than the resistance value of the load resistance in the ON state of the respectively associated analog switch.

12. A data line driver circuit as recited in claim 6, wherein:

the driver circuit is implemented in a semiconductor substrate; and each of the plurality of series-connected resistance elements is formed in the semiconductor substrate in accordance with a selected one of diffusion resistance, ion implantation resistance, and thin film resistance formation methods.

13. A data line driver circuit providing a plurality of digitally selectable, gray-scale display drive signal outputs, of a first number, for a liquid crystal display, comprising:

plural power source voltage terminals at a second number of respective and different, plural voltage levels, the second number being less than the first number;

a driver circuit output terminal;

a plurality of analog switch groups, each group comprising at least two analog switches having corresponding parallel load resistances and input terminals connected to corresponding ones of the power source voltage terminals, an output terminal connected to the driver circuit output terminal and associated switching terminals for receiving corresponding input ON signals, each analog switch being selectively switched to an ON condition by a corresponding input ON signal;

a source of display data signals defining the specific gray-scale value, of the first number of gray-scale values, of a display to be produced by the liquid crystal display; and a selection circuit having input terminals connected to the display data signal source for receiving the display data signals, having output terminals respectively connected to the associated switching terminals of the plurality of analog switches, and being responsive to the received display data signals for selectively generating at and transmitting from the output terminals thereof at least one input ON signal to the associated input terminal of an analog switch of each analog switch group in accordance with and in response to the specific gray-scale value defined by the received display data signals for the corresponding display to be produced, the analog switches which receive the ON signals form the selection circuit producing outputs through the corresponding load resistances thereof and thereby at the respective output terminals thereof, and which outputs are combined at the driver circuit output terminal as the thereby selected, gray-scale display drive signal output of the data line driver circuit.

14. A data line driver circuit as recited in claim 13 wherein the respective load resistances of the analog switches of each group of analog switches have corresponding, different load resistance values.

15. A data line driver circuit as recited in claim 14, wherein each group of analog switches comprises two analog switches and the corresponding load resistances thereof have a ratio of load resistance values of 1 to 2.

16. A data line driver circuit as recited in claim 13, wherein the selection circuit, in accordance with and in response to the specific gray-scale value defined by the received data display signals for the corresponding display to be produced, selectively generates and transmits a single input ON signal to the associated switching terminal of the specific analog switch which specific analog switch is connected at the input terminal thereof to the power source voltage terminal having the voltage level corresponding the specific gray-scale value defined by the received display data signal, or selectively and simultaneously generates and transmits at least first and second input ON signals to the associated input terminals of at least first and second analog switches respectively of different analog switch groups thereby to produce a display drive signal output having a voltage level which is intermediate the respective voltage levels of the respective power source voltage terminals connected to the input terminals of the at least first and second selected analog switches of the different analog switch groups, divided by the respective load resistances thereof.

17. A data line driver circuit as recited in claim 16, wherein the respective load resistances of the analog switches of each analog switch group have corresponding, different load resistance values.

18. A data line driver circuit as recited in claim 17, wherein each group of analog switches comprises two analog switches and the corresponding load resistances thereof have a ratio of load resistance values of 1 to 2.

19. A digital data driver circuit as recited in claim 16, wherein the selection circuit, in accordance with the received display data signals, simultaneously generates and transmits a corresponding number of input ON signals to a corresponding number of plural, associated input terminals of corresponding, plural analog switches of a given analog switch group thereby for varying the combined value of the corresponding load resistances and thus to vary the divided voltage level of the display drive signal output produced at the driver circuit output terminal.

20. A data line driver circuit as recited in claim 19, wherein the corresponding load resistances of the analog switches of each analog switch group have respective, different load resistance values.

21. A data line driver circuit as recited in claim 20, wherein each group of analog switches comprises two analog switches and the respective load resistances thereof have a ratio of load resistance value of 1 to 2.

22. A delay line driver circuit as recited in claim 13, further comprising:

a plurality of resistance elements respectively connected between the input terminals of the plurality of analog switches and the corresponding power source voltage terminals.

23. A data line driver circuit as recited in claim 22, the respective load resistances of the analog switches of each group of analog switches have corresponding, different load resistance values.

24. A data line driver circuit as recited in claim 23, wherein each group of analog switches comprises two analog switches and the respective load resistances thereof have a ratio of load resistance values of 1 to 2.

25. A data line driver circuit as recited in claim 22, wherein the selection circuit, in accordance with and in response to the specific gray-scale value defined by the received data display signals for the corresponding display to be produced, selectively generates and transmits a single input ON signal to the associated switching terminal of the specific analog switch which specific analog switch is connected at the input terminal thereof to the power source voltage terminal having the voltage level corresponding the specific gray-scale value defined by the received display data signal, or selectively and simultaneously generates and transmits at least first and second input ON signals to the associated input terminals of at least first and second analog switches respectively of different analog switch groups thereby to produce a display drive signal output having a voltage level which is intermediate the respective voltage levels of the respective power source voltage terminals connected to the input terminals of the at least first and second selected analog switches of the different analog switch groups, divided by the respective load resistances thereof.

26. A data line driver circuit as recited in claim 25, wherein the respective load resistances of the analog switches of each group of analog switches have corresponding, different load resistance values.

27. A data line driver circuit as recited in claim 26, wherein each group of analog switches comprises two analog switches and the respective load resistances thereof have a ratio of load resistance values of 1 to 2.

28. A data line driver circuit as recited in claim 25, wherein the selection circuit, in accordance with the received display data signals, simultaneously generates and transmits a corresponding number of input ON signals to a corresponding number of plural, associated input terminals of corresponding, plural analog switches of a given analog switch group thereby for varying the combined value of the corresponding load resistances and thus to vary the divided voltage level of the display drive signal output produced at the driver circuit output terminal.

29. A data line driver circuit as recited in claim 28, wherein the respective load resistances of the analog switches of each analog switch group have corresponding, different load resistance values.

30. A data line driver circuit as recited in claim 29, wherein each group of analog switches comprises two analog switches and the respective load resistances thereof have a ratio of load resistance values of 1 to 2.

31. A data line driver circuit as recited in claim 13, each analog switch, when switched to an ON-state by receipt of an ON-signal from the selection circuit, has a respective resistance value; and the resistance value of each of the plurality of resistance elements is higher than the resistance value of the load resistance in the ON state of the respectively associated analog switch.

32. A data line driver circuit as recited in claim 13, wherein:

the driver circuit is implemented in a semiconductor substrate; and each of the plurality of series-connected resistance elements is formed in the semiconductor substrate in accordance with a selected one of diffusion resistance, ion implantation resistance, and thin film resistance formation methods.

* * * * *

UNITED STATES PATENT AND TRADEMARK OFFICE

CERTIFICATE OF CORRECTION

PATENT NO. : 5,196,738

DATED : March 23, 1993

INVENTOR(S) : Kazuhiro TAKAHARA et al.

It is certified that error appears in the above-indentified patent and that said Letters Patent is hereby corrected as shown below:

Col. 1, line 39, change "compreses" to --comprises--.

Col. 2, line 15, after "compared" delete ",";
line 39, after "voltage" delete ";".

Col. 4, line 68, delete "shown".

Col. 5, line 4, change "one Of them is" to --which are respectively--;
line 54, after "increases" insert --,--;
line 61, change "for" to --of--;
line 68, change "of (i.e., as a function)" to --(i.e., as a function) of--.

Col. 6, line 36, change "compreses" to --comprises--;
line 58, after "17N" insert --,--.

Col. 7, line 54, change "3,2" to --3.2--.

Col. 8, line 46, after "illustrating" insert --the--;
line 53, change "resistance" to --resistances--;
line 68, change "3,2" to --3.2--.

Col. 10, line 57, delete "an".

Col. 11, line 21, change "R/Ron" to --ΔR/Ron--;
line 59, delete "for".

UNITED STATES PATENT AND TRADEMARK OFFICE

CERTIFICATE OF CORRECTION

PATENT NO. : 5,196,738 Page 2 of 2

DATED : March 23, 1993

INVENTOR(S) : Kazuhiro TAKAHARA et al.

It is certified that error appears in the above-indentified patent and that said Letters Patent is hereby corrected as shown below:

Col. 14, line 43, change "plural-" to --plural--;
line 44, delete "ity".

Col. 17, line 3, after "22," insert --wherein--.

Signed and Sealed this

Fourteenth Day of June, 1994

*Attest:*

BRUCE LEHMAN

*Attesting Officer* *Commissioner of Patents and Trademarks*